US012205831B2

(12) United States Patent
Miyazaki et al.

(10) Patent No.: US 12,205,831 B2
(45) Date of Patent: Jan. 21, 2025

(54) CLEANING APPARATUS AND POLISHING APPARATUS

(71) Applicant: EBARA CORPORATION, Tokyo (JP)

(72) Inventors: Mitsuru Miyazaki, Tokyo (JP); Tomoaki Fujimoto, Tokyo (JP); Koichi Fukaya, Tokyo (JP); Fumitoshi Oikawa, Tokyo (JP); Takuya Inoue, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 0 days.

(21) Appl. No.: 18/444,981

(22) Filed: Feb. 19, 2024

(65) Prior Publication Data
US 2024/0194498 A1 Jun. 13, 2024

Related U.S. Application Data

(62) Division of application No. 17/128,643, filed on Dec. 21, 2020, now Pat. No. 11,948,811.

(30) Foreign Application Priority Data

Dec. 26, 2019 (JP) ................................. 2019-236617
Dec. 26, 2019 (JP) ................................. 2019-236734

(51) Int. Cl.
H01L 21/67 (2006.01)
B08B 1/32 (2024.01)
(Continued)

(52) U.S. Cl.
CPC .......... *H01L 21/67051* (2013.01); *B08B 1/32* (2024.01); *B08B 3/024* (2013.01);
(Continued)

(58) Field of Classification Search
CPC ........ B08B 1/32; B08B 1/34; H01L 21/67046
See application file for complete search history.

(56) References Cited

U.S. PATENT DOCUMENTS 4,935,981 A 6/1990 Ohtani et al.
5,775,983 A 7/1998 Shendon et al.
(Continued)

FOREIGN PATENT DOCUMENTS

CN 107086190 A 8/2017
CN 108780746 A 11/2018
(Continued)

*Primary Examiner* — Andrew A Horton
(74) *Attorney, Agent, or Firm* — Chrisman Gallo Tochtrop LLC

(57) ABSTRACT

A cleaning apparatus includes: a cleaning tank that defines a cleaning space for cleaning a wafer; a wafer rotation mechanism that is arranged inside the cleaning tank and holds and rotates the wafer; a cleaning member that contacts and cleans a surface of the wafer, is rotatable around a central axis extending in a lateral direction, and has a length in an axial direction longer than a radius of the wafer; a swing mechanism that swings the cleaning member around a swing axis located inside the cleaning tank to move the cleaning member from a retracted position outside of the wafer to a cleaning position directly above the wafer; a second cleaning means that cleans the surface of the wafer; and a second swing mechanism that swings the second cleaning means around a second swing axis located inside the cleaning tank to pass directly above a center of the wafer.

12 Claims, 18 Drawing Sheets

(51) Int. Cl.
  *B08B 3/02* (2006.01)
  *B24B 7/22* (2006.01)
  *H01L 21/687* (2006.01)

(52) U.S. Cl.
  CPC ........ *B24B 7/228* (2013.01); *H01L 21/67046* (2013.01); *H01L 21/6719* (2013.01); *H01L 21/67219* (2013.01); *H01L 21/67253* (2013.01); *H01L 21/68764* (2013.01)

(56) References Cited

U.S. PATENT DOCUMENTS

| | | | |
|---|---|---|---|
| 5,846,335 | A | 12/1998 | Maekawa et al. |
| 6,092,542 | A | 7/2000 | Matsuda et al. |
| 6,543,079 | B1 | 4/2003 | Yeo |
| 6,643,882 | B1 | 11/2003 | Sotozaki et al. |
| 2001/0010103 | A1* | 8/2001 | Konishi ............ H01L 21/67046 15/97.1 |
| 2003/0032292 | A1 | 2/2003 | Noguchi |
| 2006/0234503 | A1 | 10/2006 | Yamada et al. |
| 2009/0305612 | A1 | 12/2009 | Miyazaki et al. |
| 2011/0209727 | A1 | 9/2011 | Wang et al. |
| 2012/0052190 | A1 | 3/2012 | Sasagawa et al. |
| 2014/0373884 | A1 | 12/2014 | Shinozaki |
| 2017/0236730 | A1 | 8/2017 | Imamura et al. |
| 2019/0088510 | A1 | 3/2019 | Ishibashi |

FOREIGN PATENT DOCUMENTS

| | | |
|---|---|---|
| CN | 109482538 A | 3/2019 |
| JP | H08-071511 A | 3/1996 |
| JP | H11-138436 A | 5/1999 |
| JP | H11-238713 A | 8/1999 |
| JP | H11-354480 A | 12/1999 |
| JP | 2001-007069 A | 1/2001 |
| JP | 2003-077808 A | 3/2003 |
| JP | 2004-193568 A | 7/2004 |
| JP | 2007-529106 A | 10/2007 |
| JP | 2010050436 A | 3/2010 |
| JP | 2011-181644 A | 9/2011 |
| JP | 2012-054406 A | 3/2012 |
| JP | 2019-201068 A | 11/2019 |
| KR | 10-2010-0060676 A | 6/2010 |
| WO | 2007/063804 A1 | 6/2007 |

* cited by examiner

CLEANING APPARATUS AND POLISHING APPARATUS

CROSS-REFERENCE TO RELATED APPLICATIONS

This is a divisional of U.S. patent application Ser. No. 17/128,643 filed on Dec. 21, 2020, which claims the benefit of Japanese Priority Patent Application JP 2019-236617 filed on Dec. 26, 2019 and Japanese Priority Patent Application JP 2019-236734 filed on Dec. 26, 2019, all of which are hereby incorporated by reference in their entirety as if set forth herein.

FIELD

The present technology relates to a cleaning apparatus and a polishing apparatus.

BACKGROUND AND SUMMARY

In the process of manufacturing a semiconductor device, various treatments such as film formation, etching, and polishing are performed on the surface of a substrate such as a semiconductor wafer. Before and after these various treatments, it is required to keep clean the surface of the substrate, so that a cleaning process of the substrate is performed. For the cleaning process of the substrate, a cleaning machine is widely used in which the substrate is rotated by rotationally driving a plurality of rollers while holding the peripheral edge of the substrate by the rollers, and pressing a cleaning member against the rotating substrate to clean the substrate.

JP 11-238713 A (Patent Document 1) discloses a roll cleaning machine using a roll-like sponge as a cleaning member. The cleaning machine of JP 11-238713 A has a megasonic nozzle that supplies a cleaning solution vibrated by ultrasonic waves to the surface of the substrate at a position near the peripheral edge. The cleaning machine of JP 11-238713 A has a drive mechanism that runs (translates) a cleaning member made of a roll-like sponge along a guide rail extending in an X-axis direction, from a cleaning position where to clean the wafer to a retracted position outside of the wafer.

In recent years, there has been an increasing market demand for non-contact cleaning by which to swing a jet cleaning means that sprays a jet stream so as to pass through the center of a wafer to clean the surface of the wafer in a non-contact manner before or after a roll scrub cleaning process.

However, inside a narrow cleaning tank, it is difficult to enable coexistence of a sponge cleaning mechanism having a sponge longer than the diameter of the wafer and a non-contact cleaning mechanism. Therefore, the current roll scrub cleaning modules can clean only the peripheral edge of the wafer surface and its vicinity in a non-contact manner.

Further, in order to meet the above-mentioned market demand, it is required to perform non-contact cleaning with another cleaning module installed before or after the roll scrub cleaning module, so that the wafer needs to pass through the wafer conveyor mechanism once. Partly because of time loss (OHT) extended by this necessity, the conventional configuration incapable of a series of cleaning treatments has had no prospect of improvement in wafer per hour (WPH) or cleaning performance.

It is desirable to provide a cleaning apparatus and a polishing apparatus capable of cleaning the surface of a wafer by swinging a second cleaning means so as to pass through the center of the wafer in the same cleaning tank before or after the roll scrub cleaning step.

Additionally, in the cleaning machine of JP 11-238713 A, a drive mechanism for moving the cleaning member from the cleaning position to the retracted position is provided inside the cleaning tank. Therefore, it is difficult to reduce the footprint of the cleaning tank.

In order to make the cleaning tank sufficiently narrow compared to the size of the wafer, it is conceivable that the drive mechanism is arranged outside the cleaning tank, and a large opening for running the drive mechanism from the cleaning position to the retracted position is provided on the side wall of the cleaning tank, and the opening is opened and closed by a shutter.

In such a configuration, however, if a chemical solution is supplied while the shutter is open, there is a risk of the chemical solution scattering outside the tank during wafer cleaning or scrubbing. Therefore, when the shutter is open, the liquid supply system must be stopped, thereby causing time loss (OHT). Further, not only when the shutter is open but also when the shutter is closed, there is a certain gap between the side wall of the cleaning tank and the shutter, and thus there is a risk of a chemical atmosphere leaking to the outside of the cleaning tank from this gap.

It is desired to provide a cleaning apparatus and a polishing apparatus capable of moving a cleaning member from a retracted position to a cleaning position, which reduces the footprint of a cleaning tank without forming an opening for running on the side wall of the cleaning tank.

A cleaning apparatus according to an embodiment includes:
  a cleaning tank that defines a cleaning space for cleaning a wafer;
  a wafer rotation mechanism that is arranged inside the cleaning tank and holds and rotates the wafer;
  a cleaning member that contacts and cleans a surface of the wafer, is rotatable around a central axis extending in a lateral direction, and has a length in an axial direction longer than a radius of the wafer;
  a swing mechanism that swings the cleaning member around a swing axis located inside the cleaning tank to move the cleaning member from a retracted position outside of the wafer to a cleaning position directly above the wafer;
  a second cleaning means that cleans the surface of the wafer; and
  a second swing mechanism that swings the second cleaning means around a second swing axis located inside the cleaning tank to pass directly above a center of the wafer.

A polishing apparatus according to an embodiment includes:
  a polishing unit that polishes a wafer; and
  a cleaning unit that cleans the wafer after polishing, wherein
  the cleaning unit includes:
  a cleaning tank that defines a cleaning space for cleaning a wafer;
  a wafer rotation mechanism that is arranged inside the cleaning tank and holds and rotates the wafer;
  a cleaning member that contacts and cleans a surface of the wafer, is rotatable around a central axis extending in a lateral direction, and has a length in an axial direction longer than a radius of the wafer;
  a swing mechanism that swings the cleaning member around a swing axis located inside the cleaning tank to move the cleaning member from a retracted position outside of the wafer to a cleaning position directly above the wafer;

a second cleaning means that cleans the surface of the wafer; and a second swing mechanism that swings the second cleaning means around a second swing axis located inside the cleaning tank to pass directly above a center of the wafer.

A cleaning apparatus according to an embodiment includes:

a cleaning tank that defines a cleaning space for cleaning a wafer;

a wafer rotation mechanism that is arranged inside the cleaning tank and holds and rotates the wafer;

a cleaning member that contacts and cleans a surface of the wafer, and is rotatable around a central axis extending in a lateral direction; and a swing mechanism that swings the cleaning member around a swing axis located inside the cleaning tank to move the cleaning member from a retracted position outside of the wafer to a cleaning position directly above the wafer, wherein a length of the cleaning member is longer than a radius of the wafer, a distance from a center of the cleaning member to the swing axis is smaller than a diameter of the wafer, and when the swing mechanism swings the cleaning member around the swing axis, the cleaning member passes directly above a center of the wafer.

A polishing apparatus according to an embodiment includes:

a polishing unit that polishes a wafer; and a cleaning unit that cleans the wafer after polishing, wherein the cleaning unit includes:

a cleaning tank that defines a cleaning space for cleaning a wafer;

a wafer rotation mechanism that is arranged inside the cleaning tank and holds and rotates the wafer;

a cleaning member that contacts and cleans a surface of the wafer, and is rotatable around a central axis extending in a lateral direction; and a swing mechanism that swings the cleaning member around a swing axis located inside the cleaning tank to move the cleaning member from a retracted position outside of the wafer to a cleaning position directly above the wafer, wherein a length of the cleaning member is longer than a radius of the wafer, a distance from a center of the cleaning member to the swing axis is smaller than a diameter of the wafer, and when the swing mechanism swings the cleaning member around the swing axis, the cleaning member passes directly above a center of the wafer.

DETAILED DESCRIPTION OF NON-LIMITING EXAMPLE EMBODIMENTS

Figure 1:
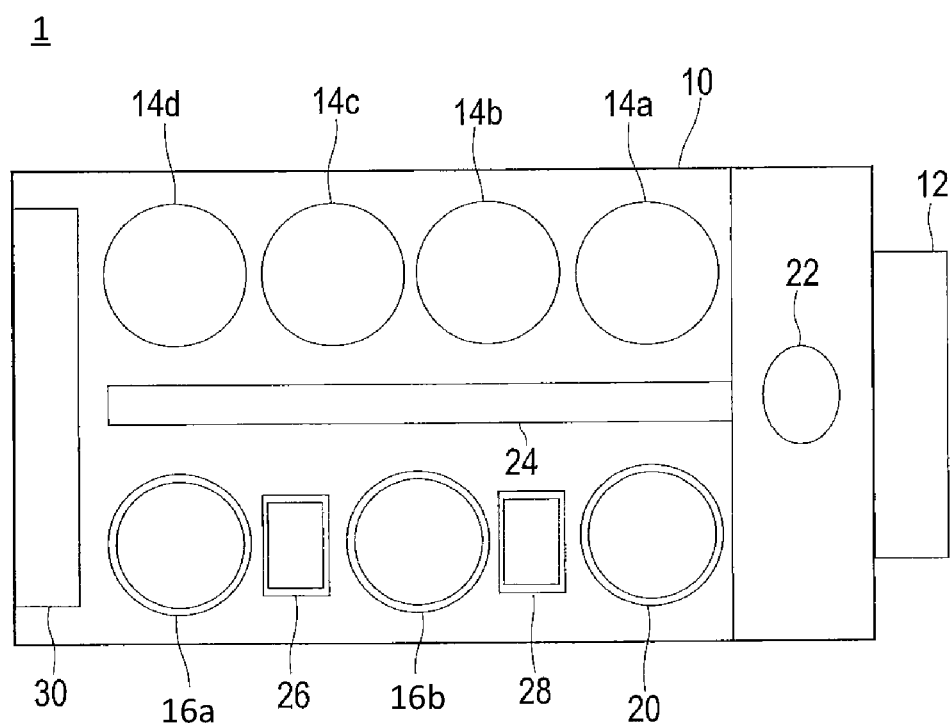
FIG. 1 is a plan view of the overall configuration of a polishing apparatus according to an embodiment.

A cleaning apparatus according to a first aspect of an embodiment includes:

a cleaning tank that defines a cleaning space for cleaning a wafer;

a wafer rotation mechanism that is arranged inside the cleaning tank and holds and rotates the wafer;

a cleaning member that contacts and cleans a surface of the wafer, is rotatable around a central axis extending in a lateral direction, and has a length in an axial direction longer than a radius of the wafer;

a swing mechanism that swings the cleaning member around a swing axis located inside the cleaning tank to move the cleaning member from a retracted position outside of the wafer to a cleaning position directly above the wafer;

a second cleaning means that cleans the surface of the wafer; and a second swing mechanism that swings the second cleaning means around a second swing axis located inside the cleaning tank to pass directly above a center of the wafer.

According to this aspect, even if the cleaning member is a long member that is longer than the radius of the wafer, the cleaning member is moved from the retracted position to the cleaning position by swinging around the swing axis, so that it is possible to reduce a space required for moving the cleaning member from the cleaning position to the retracted position (a space through which the cleaning member passes) as compared with the case where the cleaning member is linearly moved (run) from the retracted position to the cleaning position. Additionally, since the swing axis is located inside the cleaning tank, it is not required to form an opening for running on the side wall of the cleaning tank. Therefore, in the cleaning apparatus capable of moving the cleaning member from the retracted position to the cleaning position, it is possible to reduce the footprint of the cleaning tank without forming an opening for running on the side wall of the cleaning tank. Further, since it is not required to form an opening for running on the side wall of the cleaning tank, it is possible to correct the leakage of the chemical liquid atmosphere to the outside of the cleaning tank. Moreover, the cleaning member that is swung around the swing axis and moved from the retracted position to the cleaning position and the second cleaning means that is swung around the second swing axis and caused to pass directly above the center of the wafer are arranged in the same cleaning tank, so that, before or after the roll scrub cleaning step by the cleaning member, the second cleaning means can be swung so as to pass through the center of the wafer to clean the surface of the wafer in the same cleaning tank.

A cleaning apparatus according to a second aspect of the embodiment is a cleaning apparatus according to the first aspect, wherein
  a distance from a center of the cleaning member to the swing axis is smaller than a diameter of the wafer, and
  when the swing mechanism swings the cleaning member around the swing axis, the cleaning member passes directly above the center of the wafer.

According to this aspect, even if the cleaning member is a long member that is longer than the radius of the wafer, the distance from the center of the cleaning member to the swing axis is prescribed as being smaller than the diameter of the wafer, and the cleaning member is moved from the retracted position to the cleaning position by swinging around the swing axis, so that it is possible to reduce a space required for moving the cleaning member from the cleaning position to the retracted position (a space through which the cleaning member passes) as compared with the case where the cleaning member is linearly moved (run) from the retracted position to the cleaning position.

A cleaning apparatus according to a third aspect of the embodiment is a cleaning apparatus according to the first or second aspect, wherein
  the swing axis is located at a position away from an extension of the central axis of the cleaning member.

According to this aspect, since the swing axis is not on the extension of the central axis of the cleaning member, the distance from the center of the cleaning member to the swing axis can be reduced to less than half the length of the cleaning member. This further reduces the space required for moving the cleaning member from the cleaning position to the retracted position (the space through which the cleaning member passes), and makes the footprint of the cleaning tank smaller.

A cleaning apparatus according to a fourth aspect of the embodiment is a cleaning apparatus according to any one of the first to third aspects, wherein
  a swing angle at which the swing mechanism moves the cleaning member from the retracted position to the cleaning position is smaller than 90°.

According to this aspect, it is possible to further reduce the space required for moving the cleaning member from the cleaning position to the retracted position (the space through which the cleaning member passes) and make the footprint of the cleaning tank smaller, as compared with the case where the swing angle at which the swing mechanism moves the cleaning member from the retracted position to the cleaning position is equal to or greater than 90°.

A cleaning apparatus according to a fifth aspect of the embodiment is a cleaning apparatus according to any one of the first to fourth aspects, wherein
  the second cleaning means is a jet cleaning means that sprays a jet stream onto the surface of the wafer to perform non-contact cleaning.

A cleaning apparatus according to a sixth aspect of the embodiment is a cleaning apparatus according to any one of the first to fourth aspects, wherein
  the second cleaning means is a pen cleaning means that is rotatable around a central axis extending in a longitudinal direction and that contacts and cleans the surface of the wafer.

A cleaning apparatus according to a seventh aspect of the embodiment is a cleaning apparatus according to any one of the first to sixth aspects, wherein
  a distance from a center of the second cleaning means to the second swing axis is larger than the distance from the center of the cleaning member to the swing axis and is smaller than the diameter of the wafer.

A cleaning apparatus according to an eighth aspect of the embodiment is a cleaning apparatus according to any one of the first to seventh aspects, wherein
  the second swing mechanism swings the second cleaning means around the second swing axis to move the second cleaning means between a second retracted position outside the wafer and inside the cleaning tank, a second cleaning position directly above the wafer, and a maintenance position outside of the cleaning tank.

A cleaning apparatus according to a ninth aspect of the embodiment is a cleaning apparatus according to the eighth aspect, wherein
  the second swing mechanism causes the second cleaning means to retract to the outside of the cleaning tank when the cleaning member is replaced or maintained inside the cleaning tank.

According to this aspect, when the cleaning member is replaced or maintained inside the cleaning tank, the second cleaning means is retracted to the outside of the cleaning tank, so that the operator can access the cleaning member without being hindered by the second cleaning means, which results in improvement of work efficiency.

A cleaning apparatus according to a tenth aspect of the embodiment is a cleaning apparatus according to the eighth or ninth aspect, further including
  a monitoring means that monitors whether the second cleaning means is located outside the cleaning tank.

According to this aspect, it is possible to automatically check whether the second cleaning means is located outside the cleaning tank by the monitoring means without the operator's visual checking, which results in improvement of work efficiency.

A cleaning apparatus according to an eleventh aspect of the embodiment is a cleaning apparatus according to the tenth aspect, wherein the monitoring means stops operation of the second cleaning means when the second cleaning means is located outside the cleaning tank.

According to this aspect, when the second cleaning means is located outside the cleaning tank, the monitoring means automatically stops the operation of the second cleaning means, so that it is possible to prevent the operation of the second cleaning means from being erroneously continued to contaminate the outside of the cleaning tank.

A cleaning apparatus according to a twelfth aspect of the embodiment is a cleaning apparatus according to any one of the first to eleventh aspects, wherein the swing axis and the second swing axis are positioned opposite to each other when viewed from the center of the wafer.

According to this aspect, the internal space of the cleaning tank can be efficiently used, which makes the footprint of the cleaning tank smaller.

A polishing apparatus according to a thirteenth aspect of the embodiment includes:

a polishing unit that polishes a wafer; and a cleaning unit that cleans the wafer after polishing, wherein the cleaning unit includes:

a cleaning tank that defines a cleaning space for cleaning a wafer;

a wafer rotation mechanism that is arranged inside the cleaning tank and holds and rotates the wafer;

a cleaning member that contacts and cleans a surface of the wafer, is rotatable around a central axis extending in a lateral direction, and has a length in an axial direction longer than a radius of the wafer;

a swing mechanism that swings the cleaning member around a swing axis located inside the cleaning tank to move the cleaning member from a retracted position outside of the wafer to a cleaning position directly above the wafer;

a second cleaning means that cleans the surface of the wafer; and a second swing mechanism that swings the second cleaning means around a second swing axis located inside the cleaning tank to pass directly above a center of the wafer.

According to this aspect, the cleaning member is swung around the swing axis in the same cleaning tank, and even if the cleaning member is a long member that is longer than the radius of the wafer, the cleaning member is moved from the retracted position to the cleaning position by swinging around the swing axis, so that it is possible to reduce a space required for moving the cleaning member from the cleaning position to the retracted position (a space through which the cleaning member passes) as compared with the case where the cleaning member is linearly moved (run) from the retracted position to the cleaning position. Additionally, since the swing axis is located inside the cleaning tank, it is not required to form an opening for running on the side wall of the cleaning tank. Therefore, in the polishing apparatus including the cleaning module capable of moving the cleaning member from the retracted position to the cleaning position, it is possible to reduce the footprint of the cleaning tank without forming an opening for running on the side wall of the cleaning tank. Further, since it is not required to form an opening for running on the side wall of the cleaning tank, it is possible to correct the leakage of the chemical liquid atmosphere to the outside of the cleaning tank. Moreover, the cleaning member that is swung around the swing axis and moved from the retracted position to the cleaning position and the second cleaning means that is swung around the second swing axis and caused to pass directly above the center of the wafer are arranged in the same cleaning tank, so that, before or after the roll scrub cleaning step by the cleaning member, the second cleaning means can be swung so as to pass through the center of the wafer to clean the surface of the wafer in the same cleaning tank.

A polishing apparatus according to a fourteenth aspect of the embodiment is a polishing apparatus according to the thirteenth aspect, wherein a distance from a center of the cleaning member to the swing axis is smaller than a diameter of the wafer, and when the swing mechanism swings the cleaning member around the swing axis, the cleaning member passes directly above the center of the wafer.

According to this aspect, even if the cleaning member is a long member that is longer than the radius of the wafer, the distance from the center of the cleaning member to the swing axis is prescribed as being smaller than the diameter of the wafer, and the cleaning member is moved from the retracted position to the cleaning position by swinging around the swing axis, so that it is possible to reduce a space required for moving the cleaning member from the cleaning position to the retracted position (a space through which the cleaning member passes) as compared with the case where the cleaning member is linearly moved (run) from the retracted position to the cleaning position.

A polishing apparatus according to a fifteenth aspect of the embodiment is a polishing apparatus according to the thirteenth or fourteenth aspect, wherein the swing axis is located at a position away from an extension of the central axis of the cleaning member.

According to this aspect, since the swing axis is not on the extension of the central axis of the cleaning member, the distance from the center of the cleaning member to the swing axis can be reduced to less than half the length of the cleaning member. This further reduces the space required for moving the cleaning member from the cleaning position to the retracted position (the space through which the cleaning member passes), and makes the footprint of the cleaning tank smaller.

A polishing apparatus according to a sixteenth aspect of the embodiment is a polishing apparatus according to any one of the thirteenth to fifteenth aspects, wherein a swing angle at which the swing mechanism moves the cleaning member from the retracted position to the cleaning position is smaller than 90°.

According to this aspect, it is possible to further reduce the space required for moving the cleaning member from the cleaning position to the retracted position (the space through which the cleaning member passes) and make the footprint of the cleaning tank smaller, as compared with the case where the swing angle at which the swing mechanism moves the cleaning member from the retracted position to the cleaning position is equal to or greater than 90°.

A polishing apparatus according to a seventeenth aspect of the embodiment is a polishing apparatus according to any one of the thirteenth to sixteenth aspects, wherein the second cleaning means is a jet cleaning means that sprays a jet stream onto the surface of the wafer to perform non-contact cleaning.

A polishing apparatus according to an eighteenth aspect of the embodiment is a polishing apparatus according to any one of the thirteenth to sixteenth aspects, wherein the second cleaning means is a pen cleaning means that is rotatable around a central axis extending in the longitudinal direction and that contacts and cleans the surface of the wafer.

A polishing apparatus according to a nineteenth aspect of the embodiment is a polishing apparatus according to any one of the thirteenth to eighteenth aspects, wherein
a distance from a center of the second cleaning means to the second swing axis is larger than the distance from the center of the cleaning member to the swing axis and is smaller than the diameter of the wafer.

A polishing apparatus according to a twentieth aspect of the embodiment is a polishing apparatus according to any one of the thirteenth to nineteenth aspects, wherein
the second swing mechanism swings the second cleaning means around the second swing axis to move the second cleaning means between a second retracted position outside the wafer and inside the cleaning tank, a second cleaning position directly above the wafer, and a maintenance position outside of the cleaning tank.

A polishing apparatus according to a twenty-first aspect of the embodiment is a polishing apparatus according to the twentieth aspect, wherein
the second swing mechanism causes the second cleaning means to retract to the outside of the cleaning tank when the cleaning member is replaced or maintained inside the cleaning tank.

According to this aspect, when the cleaning member is replaced or maintained inside the cleaning tank, the second cleaning means is retracted to the outside of the cleaning tank, so that the operator can access the cleaning member without being hindered by the second cleaning means, which results in improvement of work efficiency.

A polishing apparatus according to a twenty-second aspect of the embodiment is a polishing apparatus according to the twentieth or twenty-first aspect, further including
a monitoring means that monitors whether the second cleaning means is located outside the cleaning tank.

According to this aspect, it is possible to automatically check whether the second cleaning means is located outside the cleaning tank by the monitoring means without the operator's visual checking, which results in improvement of work efficiency.

A polishing apparatus according to a twenty-third aspect of the embodiment is a polishing apparatus according to the twenty-second aspect, wherein
the monitoring means stops operation of the second cleaning means when the second cleaning means is located outside the cleaning tank.

According to this aspect, when the second cleaning means is located outside the cleaning tank, the monitoring means automatically stops the operation of the second cleaning means, so that it is possible to prevent the operation of the second cleaning means from being erroneously continued to contaminate the outside of the cleaning tank.

A polishing apparatus according to a twenty-fourth aspect of the embodiment is a polishing apparatus according to any one of the thirteenth to twenty-third aspects, wherein
the swing axis and the second swing axis are positioned opposite to each other when viewed from the center of the wafer.

According to this aspect, the internal space of the cleaning tank can be efficiently used, which makes the footprint of the cleaning tank smaller.

A cleaning apparatus according to a twenty-fifth aspect of the embodiment includes:

a cleaning tank that defines a cleaning space for cleaning a wafer;
a wafer rotation mechanism that is arranged inside the cleaning tank and holds and rotates the wafer;
a cleaning member that contacts and cleans a surface of the wafer, and is rotatable around a central axis extending in a lateral direction; and
a swing mechanism that swings the cleaning member around a swing axis located inside the cleaning tank to move the cleaning member from a retracted position outside of the wafer to a cleaning position directly above the wafer, wherein
a length of the cleaning member is longer than a radius of the wafer,
a distance from a center of the cleaning member to the swing axis is smaller than a diameter of the wafer, and
when the swing mechanism swings the cleaning member around the swing axis, the cleaning member passes directly above a center of the wafer.

According to this aspect, even if the cleaning member is a long member that is longer than the radius of the wafer, the distance from the center of the cleaning member to the swing axis is prescribed as being smaller than the diameter of the wafer, and the cleaning member is moved from the retracted position to the cleaning position by swinging around the swing axis, so that it is possible to reduce a space required for moving the cleaning member from the cleaning position to the retracted position (a space through which the cleaning member passes) as compared with the case where the cleaning member is linearly moved (run) from the retracted position to the cleaning position. Additionally, since the swing axis is located inside the cleaning tank, it is not required to form an opening for running on the side wall of the cleaning tank. Therefore, in the cleaning apparatus capable of moving the cleaning member from the retracted position to the cleaning position, it is possible to reduce the footprint of the cleaning tank without forming an opening for running on the side wall of the cleaning tank. Further, since it is not required to form an opening for running on the side wall of the cleaning tank, it is possible to correct the leakage of the chemical liquid atmosphere to the outside of the cleaning tank.

A cleaning apparatus according to a twenty-sixth aspect of the embodiment is a cleaning apparatus according to the twenty-fifth aspect, wherein
the swing axis is located at a position away from an extension of the central axis of the cleaning member.

According to this aspect, since the swing axis is not on the extension of the central axis of the cleaning member, the distance from the center of the cleaning member to the swing axis can be reduced to less than half the length of the cleaning member. This further reduces the space required for moving the cleaning member from the cleaning position to the retracted position (the space through which the cleaning member passes), and makes the footprint of the cleaning tank smaller.

A cleaning apparatus according to a twenty-seventh aspect of the embodiment is a cleaning apparatus according to the twenty-fifth or twenty-sixth aspect, wherein
a swing angle at which the swing mechanism moves the cleaning member from the retracted position to the cleaning position is smaller than 90°.

According to this aspect, it is possible to further reduce the space required for moving the cleaning member from the cleaning position to the retracted position (the space through which the cleaning member passes) and make the footprint of the cleaning tank smaller, as compared with the case where the swing angle at which the swing mechanism moves the cleaning member from the retracted position to the cleaning position is equal to or greater than 90°.

A cleaning apparatus according to a twenty-eighth aspect of the embodiment is a cleaning apparatus according to any one of the twenty-fifth to twenty-seventh aspects, further comprising:
- a raising and lowering mechanism that raises and lowers the cleaning member; and
- a load control mechanism that controls a load applied by the cleaning member to the surface of the wafer.

A cleaning apparatus according to the twenty-ninth aspect of the embodiment is a cleaning apparatus according to the twenty-eighth aspect, wherein
the raising and lowering mechanism has:
- a pillar part that longitudinally extends and is provided so as to penetrate through a wall surface of the cleaning tank;
- an arm part that extends laterally from the pillar part; and
- a driving means that is provided at an end of the pillar part protruding to outside of the cleaning tank,
the swing mechanism is provided at a tip of the arm part, and
the raising and lowering mechanism integrally raises and lowers the cleaning member and the swing mechanism.

The cleaning apparatus according to the thirtieth aspect of the embodiment is a cleaning apparatus according to the twenty-ninth aspect, wherein
the arm part extends laterally so as to straddle above or below the retracted position.

According to this aspect, when the cleaning member is located at the retracted position, the cleaning member is housed in a space below or above the arm part, so that the internal space of the cleaning tank can be used efficiently, thereby making the footprint of the cleaning tank smaller.

A polishing apparatus according to a thirty-first aspect of the embodiment includes:
- a polishing unit that polishes a wafer; and
- a cleaning unit that cleans the wafer after polishing, wherein
the cleaning unit includes:
- a cleaning tank that defines a cleaning space for cleaning a wafer;
- a wafer rotation mechanism that is arranged inside the cleaning tank and holds and rotates the wafer;
- a cleaning member that contacts and cleans a surface of the wafer, and is rotatable around a central axis extending in a lateral direction; and
- a swing mechanism that swings the cleaning member around a swing axis located inside the cleaning tank to move the cleaning member from a retracted position outside of the wafer to a cleaning position directly above the wafer, wherein
a length of the cleaning member is longer than a radius of the wafer,
a distance from a center of the cleaning member to the swing axis is smaller than a diameter of the wafer, and
when the swing mechanism swings the cleaning member around the swing axis, the cleaning member passes directly above a center of the wafer.

According to this aspect, even if the cleaning member is a long member that is longer than the radius of the wafer, the distance from the center of the cleaning member to the swing axis is prescribed as being smaller than the diameter of the wafer, and the cleaning member is moved from the retracted position to the cleaning position by swinging around the swing axis, so that it is possible to reduce a space required for moving the cleaning member from the cleaning position to the retracted position (a space through which the cleaning member passes) as compared with the case where the cleaning member is linearly moved (run) from the retracted position to the cleaning position. Additionally, since the swing axis is located inside the cleaning tank, it is not required to form an opening for running on the side wall of the cleaning tank. Therefore, in the polishing apparatus including the cleaning module capable of moving the cleaning member from the retracted position to the cleaning position, it is possible to reduce the footprint of the cleaning tank without forming an opening for running on the side wall of the cleaning tank. Further, since it is not required to form an opening for running on the side wall of the cleaning tank, it is possible to correct the leakage of the chemical liquid atmosphere to the outside of the cleaning tank.

A polishing apparatus according to a thirty-second aspect of the embodiment is a polishing apparatus according to the thirty-first aspect, wherein
the swing axis is located at a position away from an extension of the central axis of the cleaning member.

According to this aspect, since the swing axis is not on the extension of the central axis of the cleaning member, the distance from the center of the cleaning member to the swing axis can be reduced to less than half the length of the cleaning member. This further reduces the space required for moving the cleaning member from the cleaning position to the retracted position (the space through which the cleaning member passes), and makes the footprint of the cleaning tank smaller.

A polishing apparatus according to a thirty-third aspect of the embodiment is a polishing apparatus according to the thirty-first or thirty-second aspect, wherein
a swing angle at which the swing mechanism moves the cleaning member from the retracted position to the cleaning position is smaller than 90°.

According to this aspect, it is possible to further reduce the space required for moving the cleaning member from the cleaning position to the retracted position (the space through which the cleaning member passes) and make the footprint of the cleaning tank smaller, as compared with the case where the swing angle at which the swing mechanism moves the cleaning member from the retracted position to the cleaning position is equal to or greater than 90°.

A polishing apparatus according to a thirty-fourth aspect of the embodiment is a polishing apparatus according to any one of the thirty-first to thirty-third aspects, further comprising:
- a raising and lowering mechanism that raises and lowers the cleaning member; and
- a load control mechanism that controls a load applied by the cleaning member to the surface of the wafer.

A polishing apparatus according to the thirty-fifth aspect of the embodiment is a polishing apparatus according to the thirty-fourth aspect, wherein
the raising and lowering mechanism has:
- a pillar part that longitudinally extends and is provided so as to penetrate through a wall surface of the cleaning tank;
- an arm part that extends laterally from the pillar part; and
- a driving means that is provided at an end of the pillar part protruding to outside of the cleaning tank, wherein
the swing mechanism is provided at a tip of the arm part, and
the raising and lowering mechanism integrally raises and lowers the cleaning member and the swing mechanism.

A polishing apparatus according to the thirty-sixth aspect of the embodiment is a polishing apparatus according to the thirty-fifth aspect, wherein the arm part extends laterally so as to straddle above or below the retracted position.

According to this aspect, when the cleaning member is located at the retracted position, the cleaning member is housed in a space below or above the arm part, so that the internal space of the cleaning tank can be used efficiently, thereby making the footprint of the cleaning tank smaller.

Specific examples of the embodiments will be described in detail below with reference to the accompanying drawings. In the following description and the drawings used in the following description, the same reference numerals are used for parts that can be configured in the same manner, and duplicate description is omitted.

<Substrate Processing Apparatus>

FIG. 1 is a plan view of an overall configuration of a substrate processing apparatus (also called polishing apparatus) 1 according to an embodiment.

As illustrated in FIG. 1, the substrate processing apparatus 1 has a substantially rectangular housing 10 and a load port 12 on which a substrate cassette (not shown) for stocking a plurality of wafers W (see FIG. 2 and others) is placed. The load port 12 is arranged adjacent to the housing 10. The load port 12 can be equipped with an open cassette, a standard manufacturing interface (SMIF) pod, or a front opening unified pod (FOUP). The SMIF pod and FOUP are closed containers that can house the substrate cassette inside and maintain it in an environment independent of the external space by covering with a partition wall. Examples of the wafer W include semiconductor wafers.

The housing 10 contains a plurality of polishing units 14a to 14d (four in the aspect shown in FIG. 1), a first cleaning unit 16a and a second cleaning unit 16b that clean the polished wafer W, and a drying unit 20 that dries the cleaned wafer W. The polishing units 14a to 14d are arranged along the longitudinal direction of the housing 10, and the cleaning units 16a and 16b and the drying unit 20 are also arranged along the longitudinal direction of the housing 10.

A first transport robot 22 is arranged in the area surrounded by the load port 12, the polishing unit 14a located on the load port 12 side, and the drying unit 20. Further, a transport unit 24 is arranged in parallel with the longitudinal direction of the housing 10 between the region where the polishing units 14a to 14d are aligned and the region where the cleaning units 16a and 16b and the drying unit 20 are aligned The first transport robot 22 receives the wafer W before polishing from the load port 12 and delivers it to the transport unit 24, or receives the dried wafer W taken out from the drying unit 20 from the transport unit 24.

A second transport robot 26 that delivers the wafer W between the first cleaning unit 16a and the second cleaning unit 16b is arranged between the first cleaning unit 16a and the second cleaning unit 16b. A third transport robot 28 that delivers the wafer W between the second cleaning unit 16b and the drying unit 20 is arranged between the second cleaning unit 16b and the drying unit 20.

The substrate processing apparatus 1 is also provided with a control device 30 that controls movements of the devices 14a to 14d, 16a, 16b, 22, 24, 26, and 28. As the control device 30, for example, a programmable logic controller (PLC) is used. In the aspect shown in FIG. 1, the control device 30 is arranged inside the housing 10, but the present invention is not limited to this, and the control device 30 may be arranged outside the housing 10.

As the first cleaning unit 16a and/or the second cleaning unit 16b, may be used a roll cleaning apparatus that, in the presence of a cleaning solution, brings a roll cleaning member horizontally extending into contact with the surface of the wafer W and scrubs the surface of the wafer W while turning the roll cleaning member (a cleaning apparatus 16 according to an embodiment described later), or a pencil cleaning apparatus (not shown) that, in the presence of a cleaning solution, brings a columnar pencil cleaning member extending in a vertical direction into contact with the surface of the wafer W, and scrubs the surface of the wafer W by moving the pencil cleaning member to one direction parallel to the surface of the wafer W while turning the pencil cleaning member, or a buff cleaning and polishing apparatus (not shown) that, in the presence of a cleaning solution, brings a buff cleaning polishing member with a rotation axis extending in a vertical direction into contact with the surface of the wafer W, and scrubs and polishes the surface of the wafer W by moving the buff cleaning and polishing member to one direction parallel to the surface of the wafer W while turning the buff cleaning polishing member, or a two-fluid jet cleaning apparatus (not shown) that cleans the surface of the wafer W by a two-fluid jet. Further, as the first cleaning unit 16a and/or the second cleaning unit 16b, any two or more of these roll cleaning apparatus, pencil cleaning apparatus, buff cleaning and polishing apparatus, and two-fluid jet cleaning apparatus may be used in combination.

The cleaning solution includes a rinse solution such as pure water (DIW) and a chemical solution such as ammonia hydrogen peroxide (SC1), hydrochloric acid hydrogen peroxide (SC2), sulfuric acid hydrogen peroxide (SPM), sulfuric acid hydrofluoric acid, and hydrofluoric acid. Unless otherwise specified in the present embodiment, the cleaning solution means either a rinse solution or a chemical solution.

As the drying unit 20, may be used a spin drying device that ejects isopropyl alcohol (IPA) vapor toward the rotation wafer W from a spray nozzle moving in one direction parallel to the surface of the wafer W to dry the wafer W, and further rotate the wafer W at a high speed to dry the wafer W by centrifugal force.

<Cleaning Apparatus>

Figure 2:
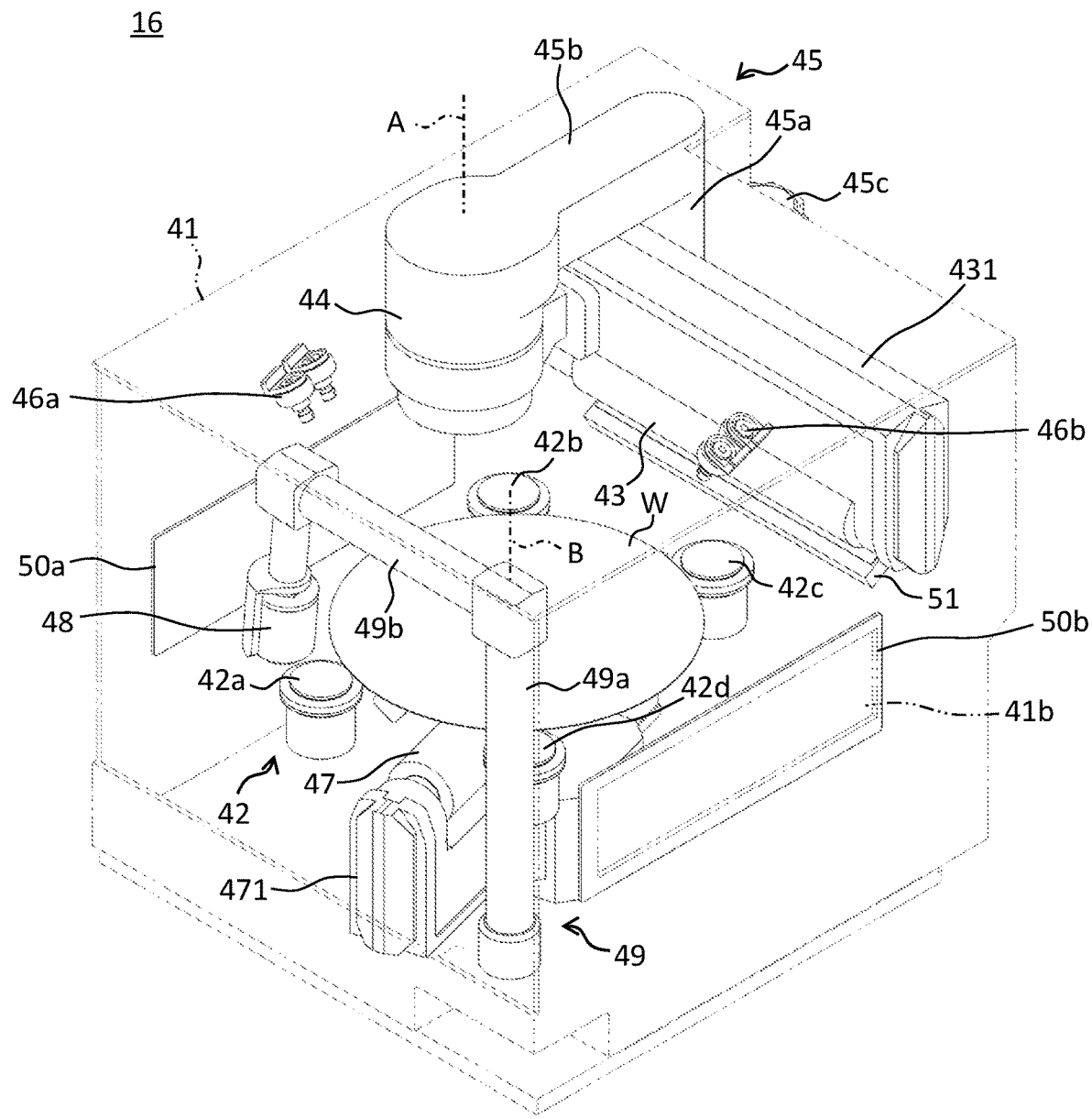
FIG. 2 is a transparent perspective view of a cleaning tank of a cleaning apparatus according to an embodiment, which shows a state in which a cleaning member is located at a retracted position.
Figure 3:
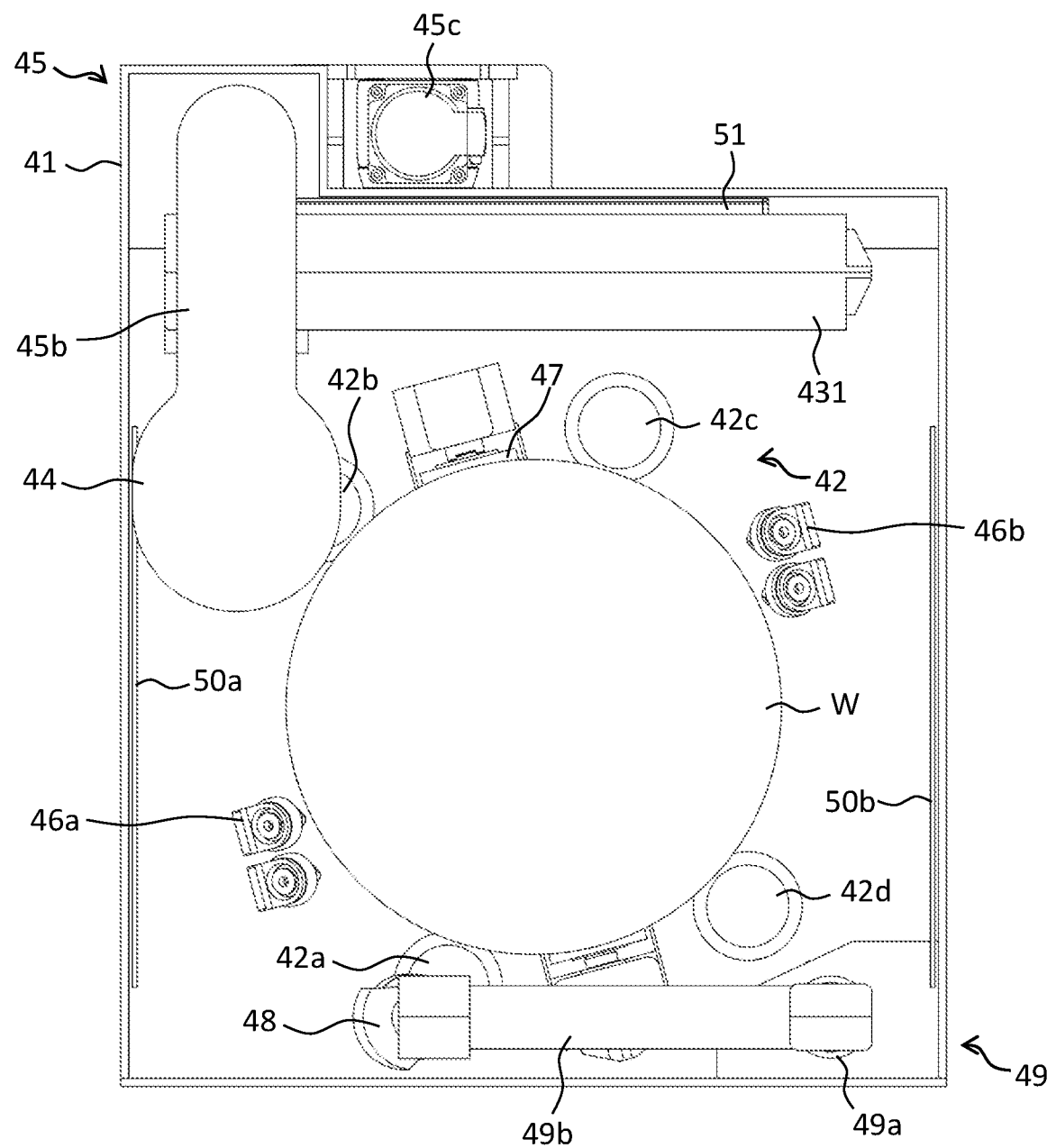
FIG. 3 is an internal plan view of the cleaning apparatus shown in FIG. 2 when viewed from above.
Figure 4:
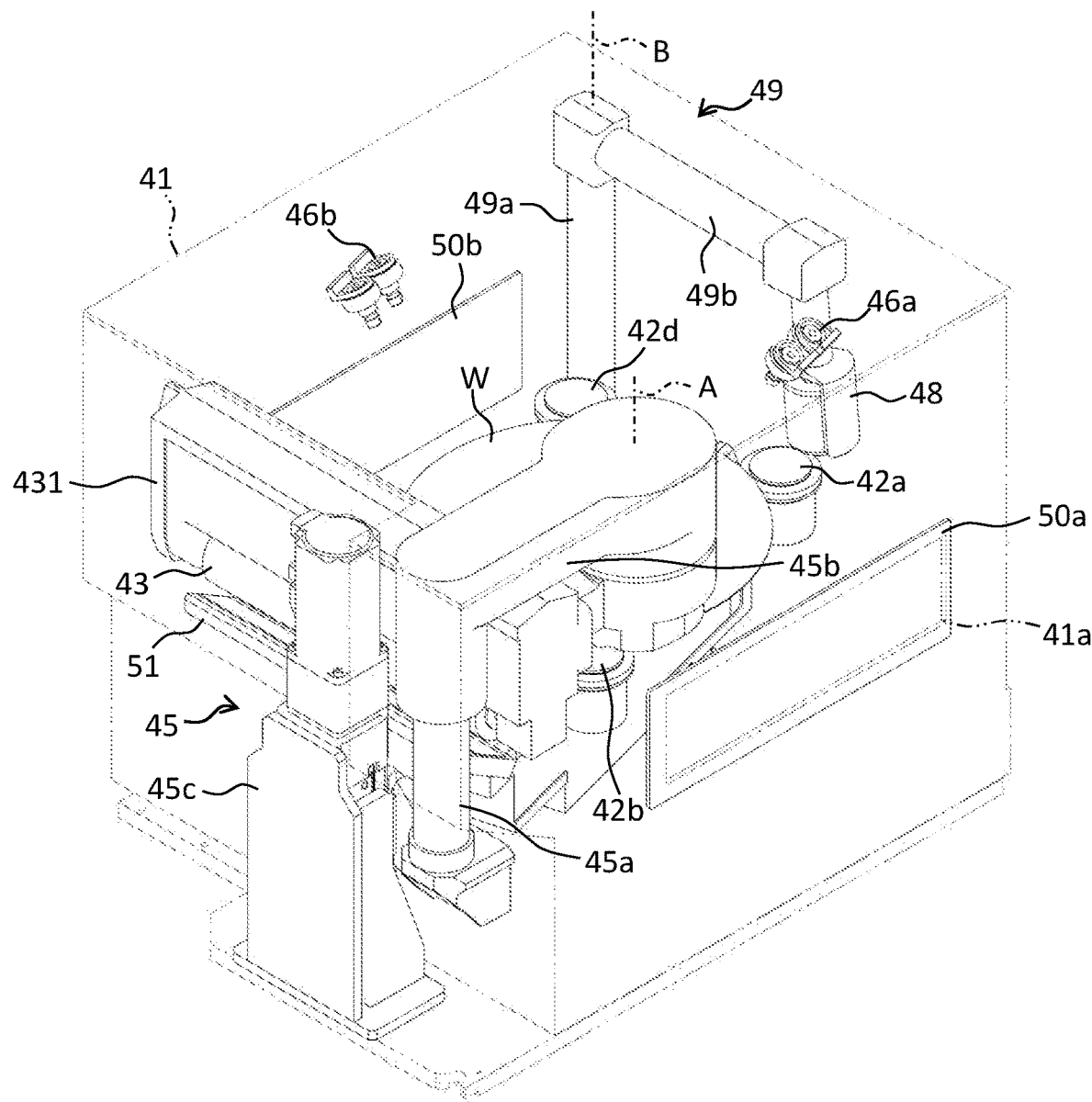
FIG. 4 is an internal perspective view of the cleaning apparatus shown in FIG. 2 when viewed from the back side.
Figure 5:
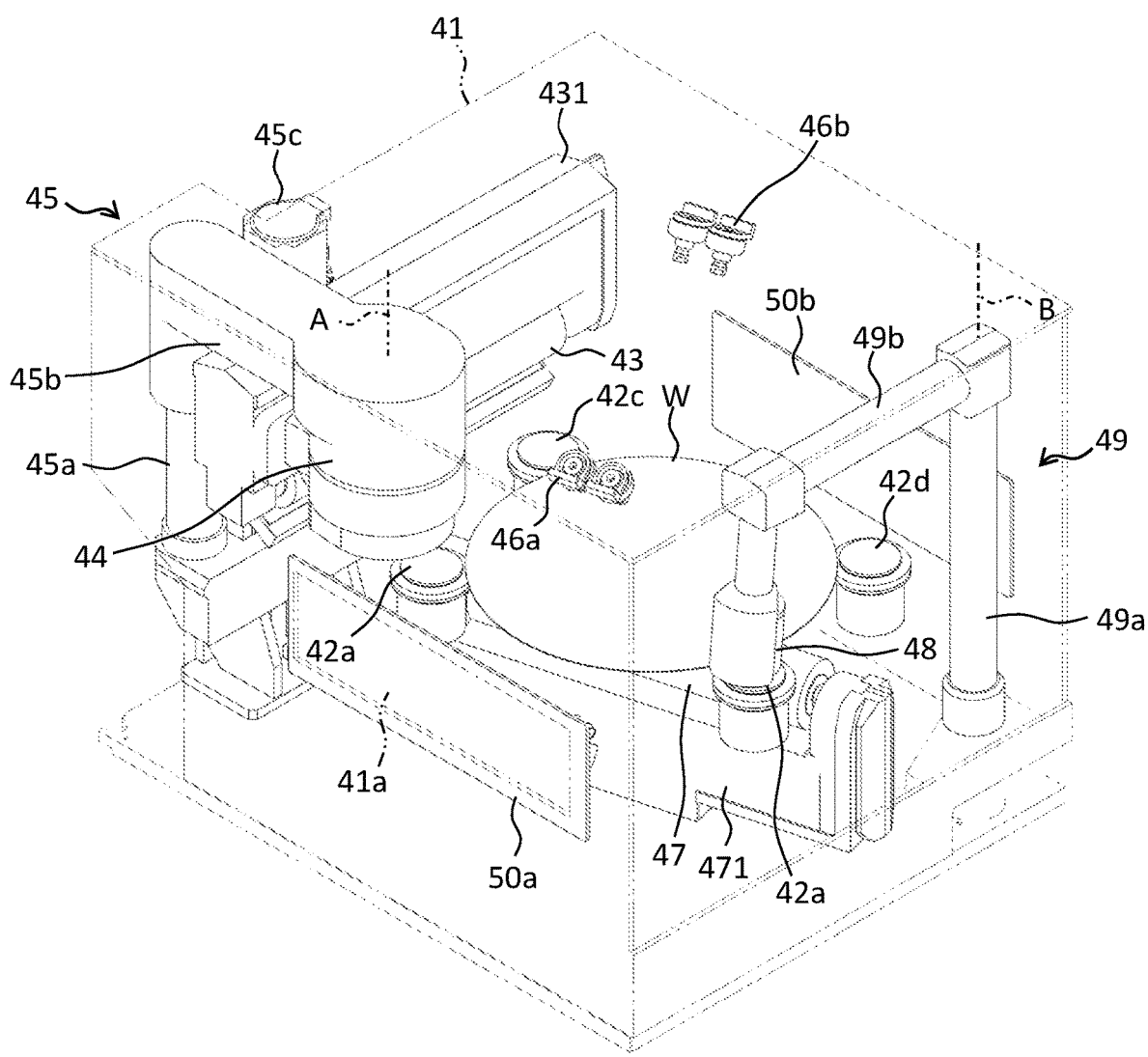
FIG. 5 is an internal perspective view of the cleaning apparatus shown in FIG. 2 when viewed from the left side.

Next, the cleaning apparatus 16 according to an embodiment will be described. FIG. 2 is a transparent perspective view of a cleaning tank 41 of the cleaning apparatus 16, which shows a state in which a cleaning member 43 is located at a retracted position. FIG. 3 is an internal plan view of the cleaning apparatus 16 shown in FIG. 2 when viewed from above. FIG. 4 is an internal perspective view of the cleaning apparatus 16 shown in FIG. 2 when viewed from the back side. FIG. 5 is an internal perspective view of the cleaning apparatus 16 shown in FIG. 2 when viewed from the left side.

The cleaning apparatus 16 according to the present embodiment can be used as the first cleaning unit 16a and/or the second cleaning unit 16b in the substrate processing apparatus 1 described above.

As shown in FIGS. 2 to 5, the cleaning apparatus 16 has: a cleaning tank 41 that defines a cleaning space for cleaning the wafer W; a wafer rotation mechanism 42 that is arranged inside the cleaning tank 41 to hold and rotate the wafer W; a cleaning member 43 that contacts and cleans the surface of the wafer W and is rotatable around a central axis extending in the lateral direction; a swing mechanism 44 that swings the cleaning member 43 around a swing axis positioned inside the cleaning tank 41 to move the cleaning member 43 from a retracted position outside the wafer W to a cleaning position directly above the wafer W; a raising and lowering mechanism 45 that raises and lowers the cleaning member 43; and liquid supply nozzles 46a and 46b that supply a cleaning solution to the wafer W.

Of these components, the cleaning tank 41 has a substantially rectangular parallelepiped shape. In the illustrated example, wafer loading/unloading ports 41a and 41b for loading or unloading the wafer W inside the cleaning tank 41 are formed on the left and right side wall surfaces of the cleaning tank 41, respectively, and the wafer loading/unloading ports 41a and 41b can be opened and closed by shutters 50a and 50b, respectively.

Inside the cleaning tank 41, arranged is a cleaning means 51 that is adjacent to the wall surface of back side of the cleaning tank 41 and extends in the left-right direction. The cleaning means 51 has a cleaning surface on which the cleaning member 43 is pressed. The cleaning surface is formed in a flat shape by quartz, for example. The material and shape of the cleaning surface may be appropriately changed depending on the material and shape of the cleaning member 43 and the like. For example, polyvinyl chloride (PVC) may be used as the material for the cleaning surface.

A chemical solution pipe, a pure water pipe, and the like (not shown) are arranged on the cleaning surface. The chemical solution sprayed from the chemical solution pipe may be the same as the chemical solution supplied to the wafer W from the liquid supply nozzles 46a and 46b. With the cleaning member 43 arranged in the retracted position, the cleaning member 43 is rotated (turned) and pressed against the cleaning means 51, and the chemical solution is sprayed toward the cleaning member 43 to remove dirt from the cleaning member 43. In this way, after the cleaning member 43 is rotated (turned) by a predetermined amount while being pressed against the cleaning means 51, the cleaning member 43 is raised and separated from the cleaning means 51, and then pure water is sprayed toward the cleaning means 51 and the cleaning member 43 to remove dirt from the cleaning means 51 and the cleaning member 43.

In the present embodiment, the wafer rotation mechanism 42 has a plurality of (four in the illustrated example) rollers 42a to 42d that hold the peripheral edge of the wafer W. When the plurality of rollers 42a to 42d is rotated (turned) by rotational driving force received from a rotational driving unit not shown (for example, a motor), the wafer W held by the plurality of rollers 42a to 42d is rotated in the direction opposite to the rotational direction of the rollers 42a to 42d due to frictional force acting between the rollers 42a to 42d and the peripheral edge of the wafer W.

As the cleaning member 43, a columnar roll sponge extending in the lateral direction can be used. As the material for the roll sponge, porous polyvinyl alcohol (PVA) sponge, urethane foam sponge, or the like can be used. The axial length of the cleaning member 43 is longer than the radius of the wafer W. The axial length of the cleaning member 43 may be longer than the diameter of the wafer W. With the cleaning member 43 arranged at the cleaning position directly above the wafer W, chemical solution and/or pure water are sprayed from the liquid supply nozzles 46a and 46b toward the surface of the rotated wafer W, and with the peripheral surface of the cleaning member 43 in contact with the surface of the wafer W, the cleaning member 43 is rotated (turned) to clean the surface of the wafer W.

In the illustrated example, a holder 431 extending parallel to the axial direction of the cleaning member 43 is arranged above the cleaning member 43. The holder 431 holds both ends of the cleaning member 43 so as to be capable of rotation (turning) around its central axis. Inside the holder 431, a motor (not shown) for rotating (turning) the cleaning member 43 around its central axis is provided. Further, a load cell (not shown) for measuring the load applied by the cleaning member 43 to the surface of the wafer W may be provided inside the holder 431. A load control mechanism (not shown) is connected to the load cell. The load control mechanism controls the operation of the raising and lowering mechanism 45 based on the measurement result of the load cell, thereby to control the load applied by the cleaning member 43 to the surface of the wafer W. The load control mechanism may be provided in the control device 30 (see FIG. 1).

In the present embodiment, the raising and lowering mechanism 45 has: a vertically extending pillar part 45a provided so as to penetrate the wall surface of the cleaning tank 41; an arm part 45b extending in the lateral direction from one end of the pillar part 45a; and a driving means 45c that is provided at the other end of the pillar part 45a protruding to the outside of the cleaning tank 41. The driving means 45c is a motor, for example.

In the illustrated example, a recess is formed in the upper part of the left end part of the side wall surface of the back side (the upper side in the plane of paper in FIG. 3) of the cleaning tank 41, and the pillar part 45a is arranged in the recess. The arm part 45b is extended from the upper end of the pillar part 45a to the front side (the lower side in the plane of paper in FIG. 3) so as to straddle above the retracted position. As a result, when the cleaning member 43 is arranged at the retracted position, the cleaning member 43 is housed in the space below the arm part 45b, so that the internal space of the cleaning tank 41 can be efficiently used, thereby making the footprint of the cleaning tank 41 smaller.

In the present embodiment, the swing mechanism 44 is provided at the tip of the arm part 45b, and a swing axis A of the swing mechanism 44 is positioned at the tip of the arm part 45b inside the cleaning tank 41. The swing mechanism 44 is a motor, for example. The end of the holder 431 holding the cleaning member 43 is held by the tip of the arm part 45b via the swing mechanism 44.

The pillar part 45a of the raising and lowering mechanism 45 is linearly moved in the longitudinal direction integrally with the arm part 45b by the linear driving force received from the driving means 45c. As a result, the swing mechanism 44, the holder 431, and the cleaning member 43 provided at the tip of the arm part 45b are also linearly moved in the longitudinal direction together with the pillar part 45a and the arm part 45b. With reference to FIGS. 2 to 5, the raising and lowering mechanism 45 is operated with the cleaning member 43 at the retracted position, so that the cleaning member 43 is moved up and down between a height position in contact with the cleaning means 51 and a height position away from the cleaning means 51.

Further, with the cleaning member 43 arranged at the height position away from the cleaning means 51, the holder 431 and the cleaning member 43 are swung (pivoted) around the swing axis A positioned at the tip of the arm part 45b by the rotational driving force received from the swing mechanism 44. As a result, the cleaning member 43 is moved from the retracted position outside of the wafer W (see FIGS. 2 to 5) to the cleaning position directly above the wafer W (see FIGS. 6 and 7). When the swing mechanism 44 swings the cleaning member 43 around the swing axis A, the cleaning member 43 may be configured to pass directly above the center of the wafer W.

Figure 6:
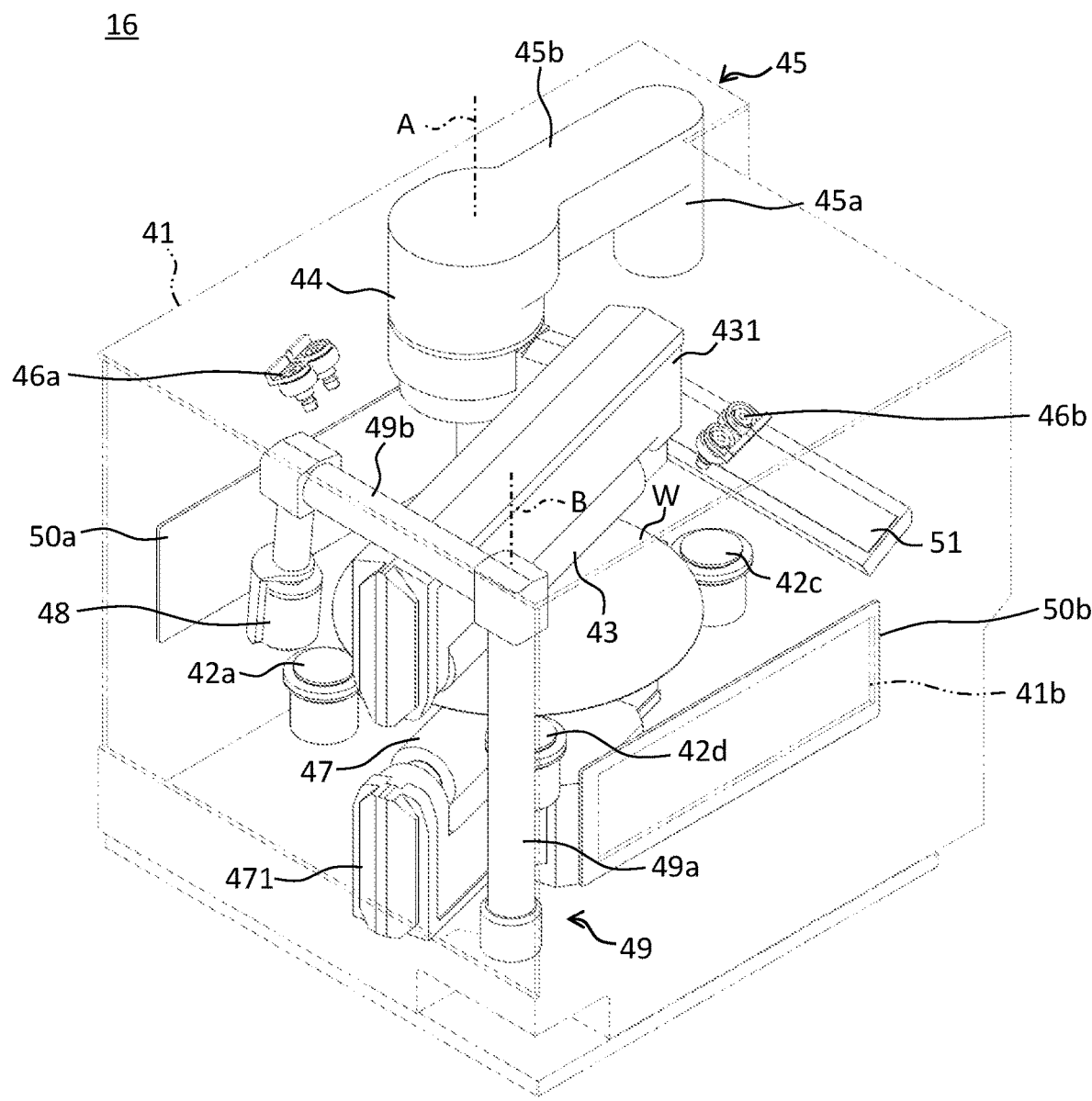
FIG. 6 is a transparent perspective view of a cleaning tank of a cleaning apparatus according to an embodiment, which shows a state in which a cleaning member is located at a cleaning position.
Figure 7:
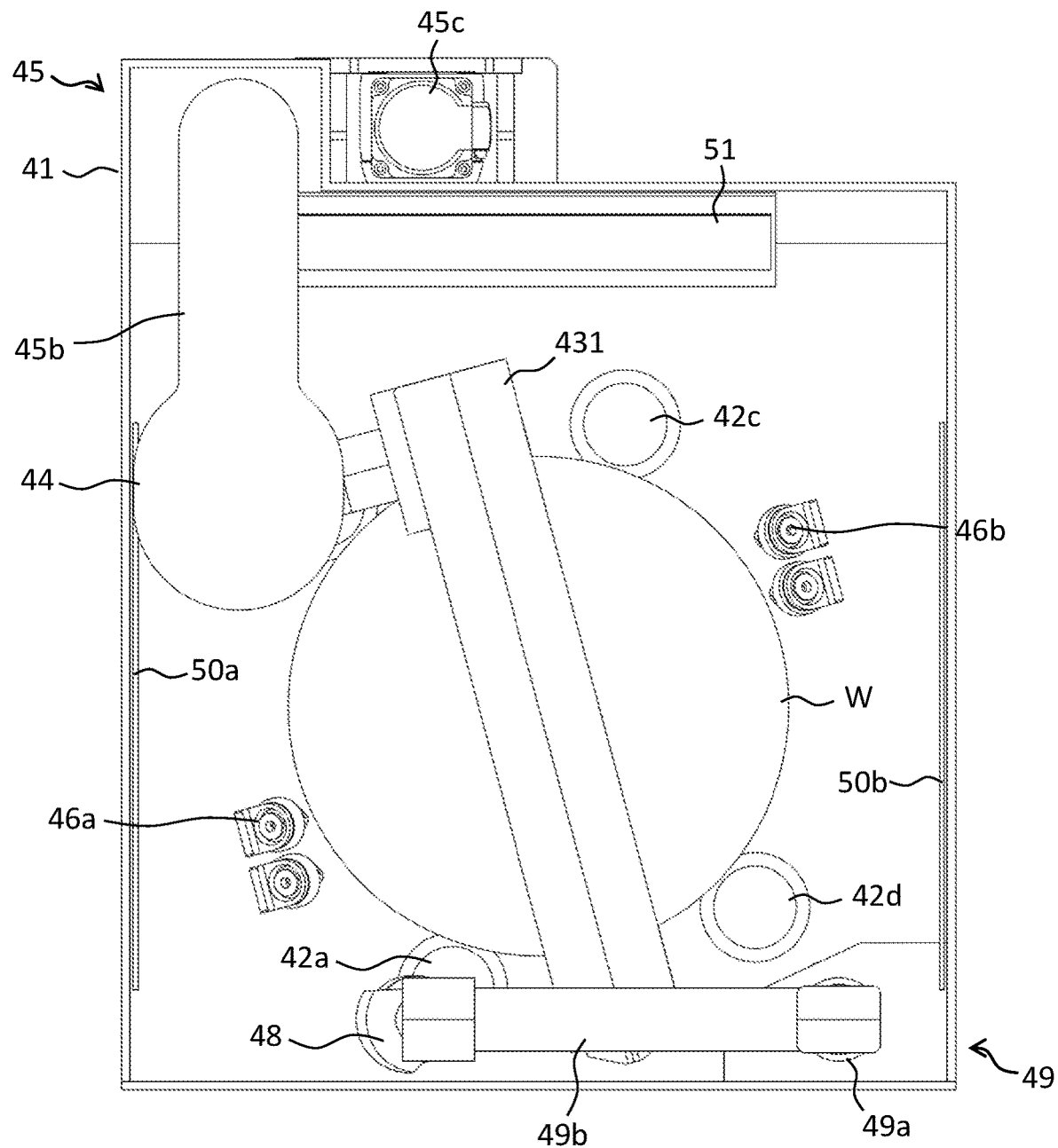
FIG. 7 is an internal plan view of the cleaning apparatus shown in FIG. 6 when viewed from above.

FIG. 6 is a transparent perspective view of the cleaning tank 41 of the cleaning apparatus 16, which shows a state in which the cleaning member 43 is located at the cleaning position. FIG. 7 is an internal plan view of the cleaning apparatus 16 shown in FIG. 6 when viewed from above.

With reference to FIGS. 6 and 7, the raising and lowering mechanism 45 is operated with the cleaning member 43 at the cleaning position, so that the cleaning member 43 is moved up and down between the height position in contact with the surface of the wafer W and the height position away from the surface of the wafer W. With the peripheral surface of the cleaning member 43 in contact with the surface of the wafer W, chemical solution and/or pure water are sprayed from the liquid supply nozzles 46*a* and 46*b* toward the surface of the rotated wafer W, and the cleaning member 43 is rotated (turned) to clean the surface of the wafer W.

Figure 8:
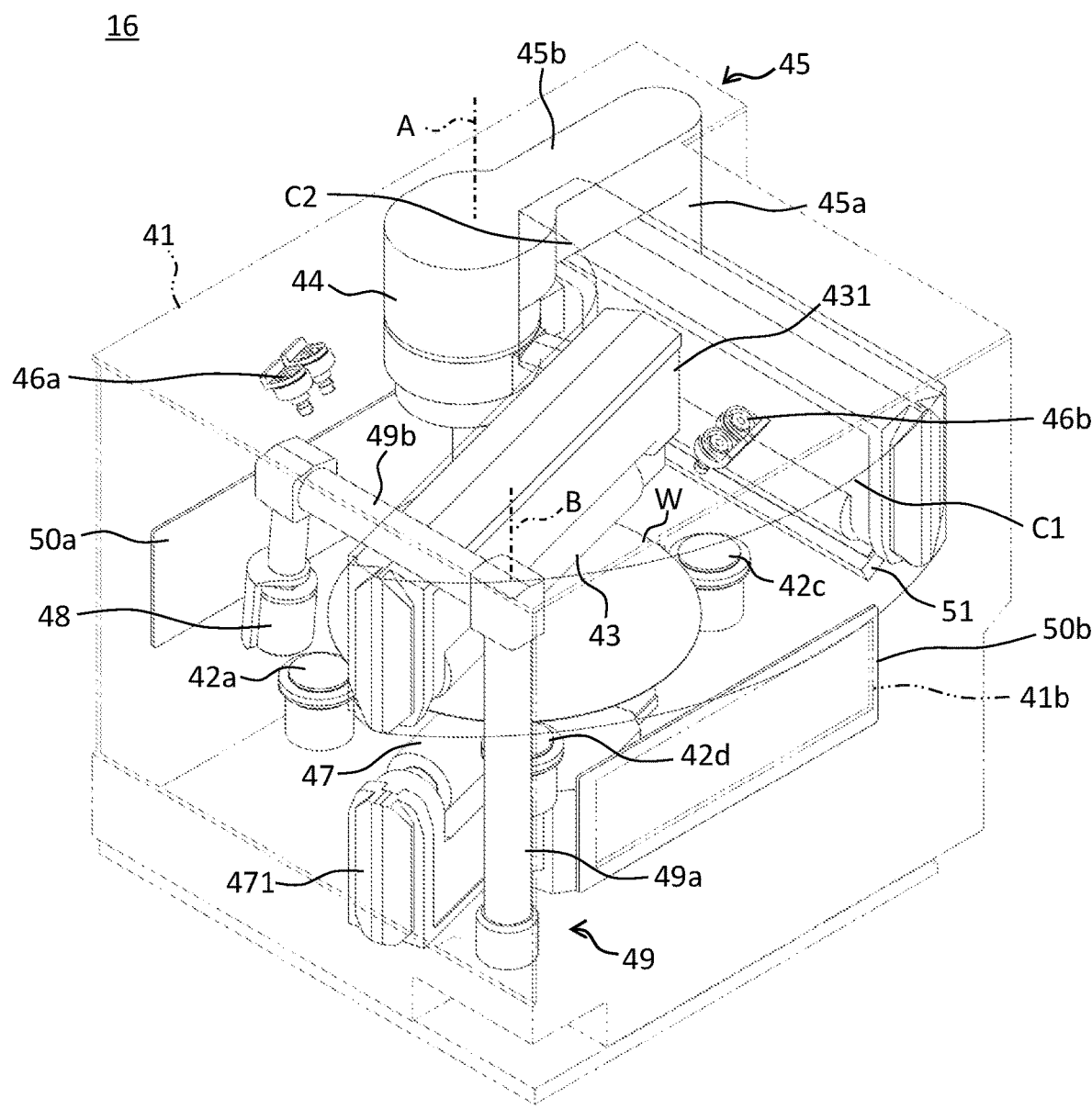
FIG. 8 is a transparent perspective view of a cleaning tank of a cleaning apparatus according to an embodiment, describing a space required for moving a cleaning member from a cleaning position to a retracted position (a space through which the cleaning member passes)
Figure 9:
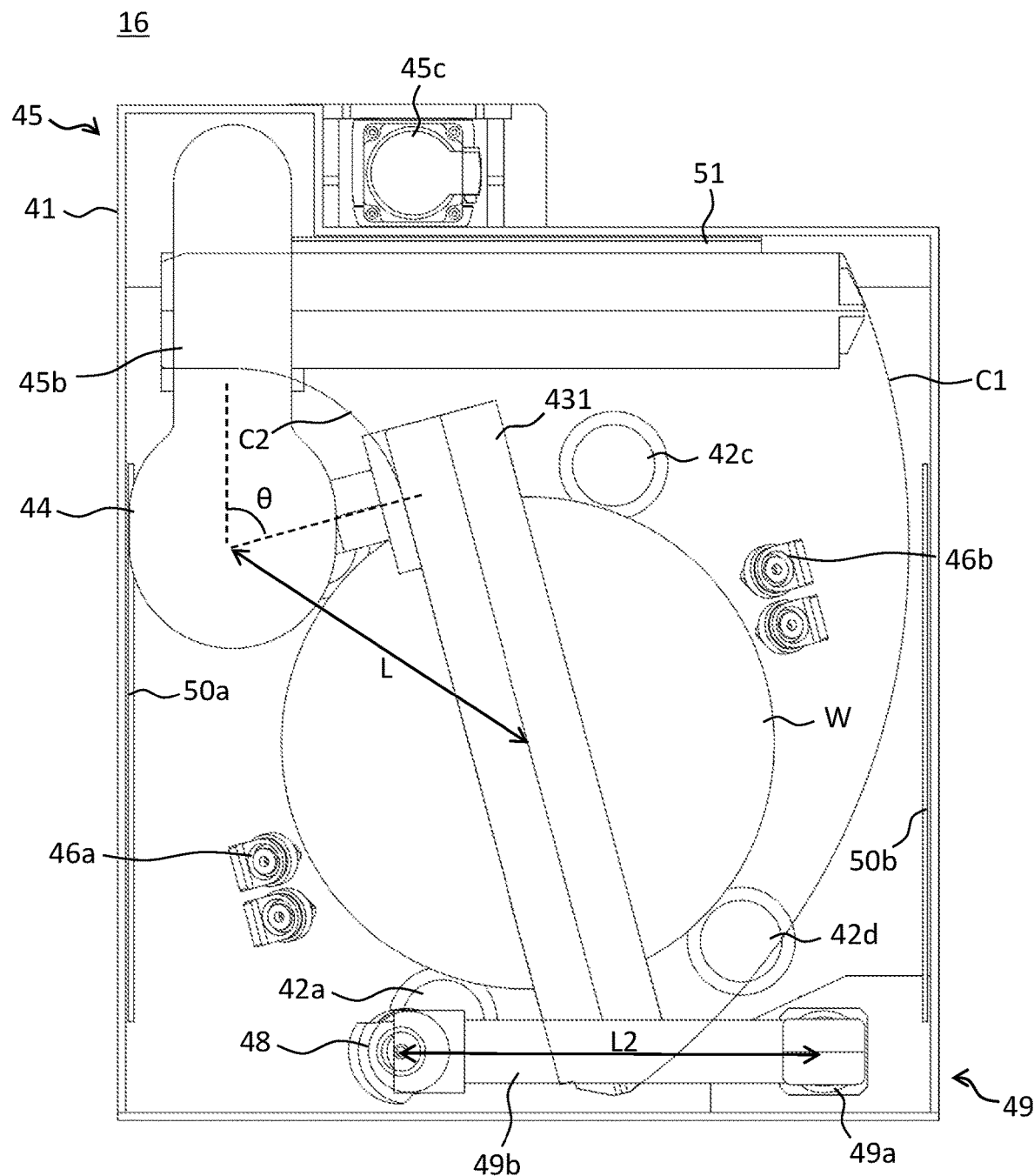
FIG. 9 is an internal plan view of the cleaning apparatus shown in FIG. 8 when viewed from above.

FIG. 8 is a transparent perspective view of the cleaning tank 41 of the cleaning apparatus 16, describing a space required for moving the cleaning member 43 from the cleaning position to the retracted position (a space through which the cleaning member passes). FIG. 9 is an internal plan view of the cleaning apparatus 16 shown in FIG. 8 when viewed from above. In FIGS. 8 and 9, the arcuate curves denoted with reference signs C1 and C2 show the outline of a space required to move the cleaning member 43 from the cleaning position to the retracted position (that is, a space through which the cleaning member 43 (the holder 431) passes).

In the present embodiment, as shown in FIG. 9, a distance L from the center of the cleaning member 43 to the swing axis A of the swing mechanism 44 (also referred to as turning radius) is smaller than the diameter D of the wafer W (L<D). As a result, as shown in FIGS. 8 and 9, even if the cleaning member 43 is a long roll sponge that is longer than the radius of the wafer W, the distance L from the center of the cleaning member 43 to the swing axis A is prescribed as being smaller than the diameter of the wafer W, and the cleaning member 43 is moved from the retracted position to the cleaning position by swinging around the swing axis A, so that it is possible to reduce the space required for moving the cleaning member 43 from the cleaning position to the retracted position as compared with the case where the cleaning member 43 is linearly moved (run) from the retracted position to the cleaning position.

In the present embodiment, as shown in FIGS. 3 and 7, the swing axis A of the swing mechanism 44 is located at a position away from the extension of the central axis of the cleaning member 43 (that is, the swing axis A is not on the extension of the central axis of the cleaning member 43). If the swing axis A is on the extension of the central axis of the cleaning member 43, it is not possible to reduce the distance L from the center of the cleaning member 43 to the swing axis A to less than half the length of the cleaning member 43 in the axial direction (because the end of the cleaning member 43 hits the swing axis A). On the other hand, in the present embodiment, since the swing axis A is not on the extension of the central axis of the cleaning member 43, the distance L from the center of the cleaning member 43 to the swing axis A can be reduced to less than half the length of the cleaning member 43. This further reduces the space required for moving the cleaning member 43 from the cleaning position to the retracted position (the space through which the cleaning member passes).

In the present embodiment, as shown in FIG. 9, a swing angle θ at which the swing mechanism 44 moves the cleaning member 43 from the retracted position to the cleaning position is smaller than 90°. This further reduces the space required for moving the cleaning member 43 from the cleaning position to the retracted position (the space through which the cleaning member passes), as compared with the case where the swing angle θ at which the cleaning member 43 is moved from the retracted position to the cleaning position is equal to or greater than 90°.

In the present embodiment, the cleaning apparatus 16 further has: a back surface cleaning member 47 that contacts and cleans the back surface of the wafer W; a second cleaning means 48 that cleans the front surface of the wafer W; and a second swing mechanism 49 that swings the second cleaning means 48 around a second swing axis B located inside the cleaning tank 41 to move the second cleaning means 48 from a second retracted position outside of the wafer W to a second cleaning position directly above the wafer W. The second swing mechanism 49 is configured to swing the second cleaning means 48 around the second swing axis B located inside the cleaning tank 41 so as to pass directly above the center of the wafer W.

As the back surface cleaning member 47, a columnar roll sponge extending in the lateral direction can be used. As the material for the roll sponge, porous polyvinyl alcohol (PVA) sponge, urethane foam sponge, or the like can be used. The back surface cleaning member 47 is arranged directly below the wafer W. The axial length of the back surface cleaning member 47 is longer than the radius of the wafer W. The axial length of the back surface cleaning member 47 may be longer than the diameter of the wafer W. With the peripheral surface of the back surface cleaning member 47 in contact with the back surface of the wafer W, chemical solution and/or pure water are sprayed from nozzles not shown toward the back surface of the rotated wafer W, and the back surface cleaning member 47 is rotated (turned) to clean the back surface of the wafer W.

In the illustrated example, a holder 471 extending parallel to the axial direction of the back surface cleaning member 47 is arranged below the back surface cleaning member 47. The holder 471 holds both ends of the back surface cleaning member 47 so as to be capable of rotation (turning) around its central axis. Inside the holder 471, a motor (not shown) for rotating (turning) the back surface cleaning member 47 around its central axis is provided. Further, a load cell (not shown) for measuring the load applied by the back surface cleaning member 47 to the front surface of the wafer W may be provided inside the holder 471. The load cell is connected to the load control mechanism (not shown) described above. The load control mechanism controls the operation of the means (not shown) for raising and lowering the back surface cleaning member 47 and the holder 471 based on the measurement result of the load cell, thereby to control the load applied by the back surface cleaning member 47 to the back surface of the wafer W.

In the present embodiment, the second cleaning means 48 is a jet cleaning means that sprays a jet stream onto the surface of the wafer W to clean in a non-contact manner. As the jet cleaning means, for example, a megasonic jet cleaning means for spraying a megasonic (high frequency ultrasonic) jet flow to clean the surface of the wafer W may be used, or a two-fluid jet cleaning means for spraying a two-fluid jet flow to clean the surface of wafer W may be used.

As a modification, the second cleaning means 48 may be a pen cleaning means (called also pencil cleaning means) that is capable of rotation (turning) around a central axis vertically extending and that contacts and cleans the surface of the wafer W in the presence of a cleaning solution, or may be a buff polishing means.

The second swing mechanism 49 has: a second pillar part 49*a* extending in the longitudinal direction that is provided so as to penetrate the wall surface (floor surface in the illustrated example) of the cleaning tank 41; a second arm part 49b extending in the lateral direction from one end (upper end in the illustrated example) of the second pillar part 49a; and a second driving means 49c (see FIG. 14) that is provided at the other end (lower end in the illustrated example) of the pillar part protruding to outside of the cleaning tank 41. The second driving means 49c is a motor, for example.

The second cleaning means 48 is supported so as to be suspended from the tip of the second arm part 49b. The second pillar part 49a is swung around the second swing axis B integrally with the second arm part 49b by the rotational driving force received from the second driving means 49c. As a result, the second cleaning means 48 provided at the tip of the second arm part 49b is also swung (turned) around the second swing axis B together with the second pillar part 49a and the second arm part 49b.

In the present embodiment, the second pillar part 49a is arranged on the side opposite to the swing mechanism 44 when viewed from the center of the wafer W, and the second swing axis B of the second swing mechanism 49 is positioned on the side opposite to the swing axis A of the swing mechanism 44 when viewed from the center of the wafer W. As a result, the internal space of the cleaning tank 41 can be efficiently used, which makes the footprint of the cleaning tank 41 smaller.

In the present embodiment, as shown in FIG. 9, a distance L2 from the center of the second cleaning means 48 to the second swing axis B of the second swing mechanism 49 is larger than the distance L from the center of the cleaning member 43 to the swing axis A of the swing mechanism 44, and is smaller than the diameter D of the wafer W (L<L2<D).

Figure 11:
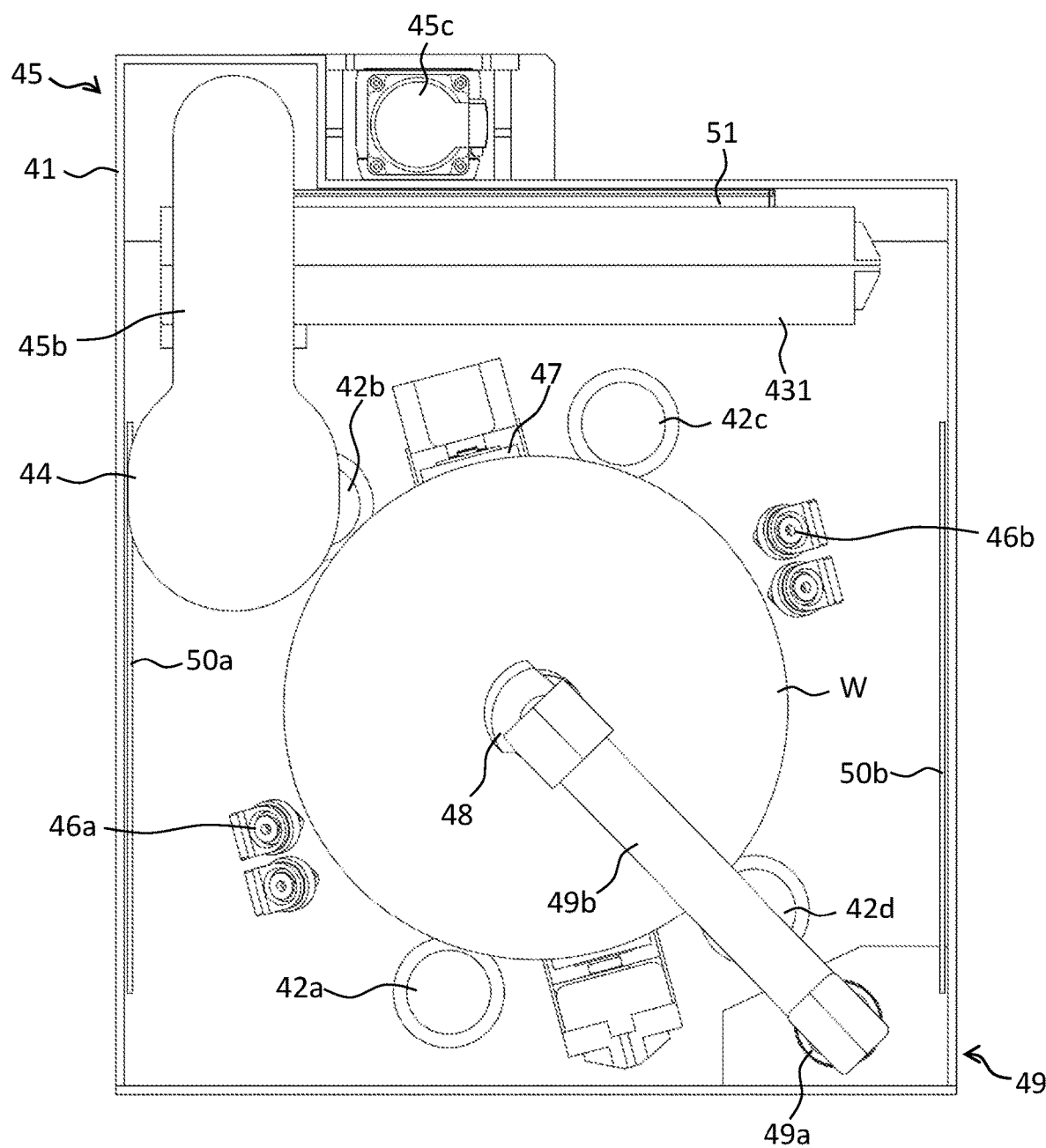
FIG. 11 is an internal plan view of the cleaning apparatus shown in FIG. 10 when viewed from above.
Figure 12:
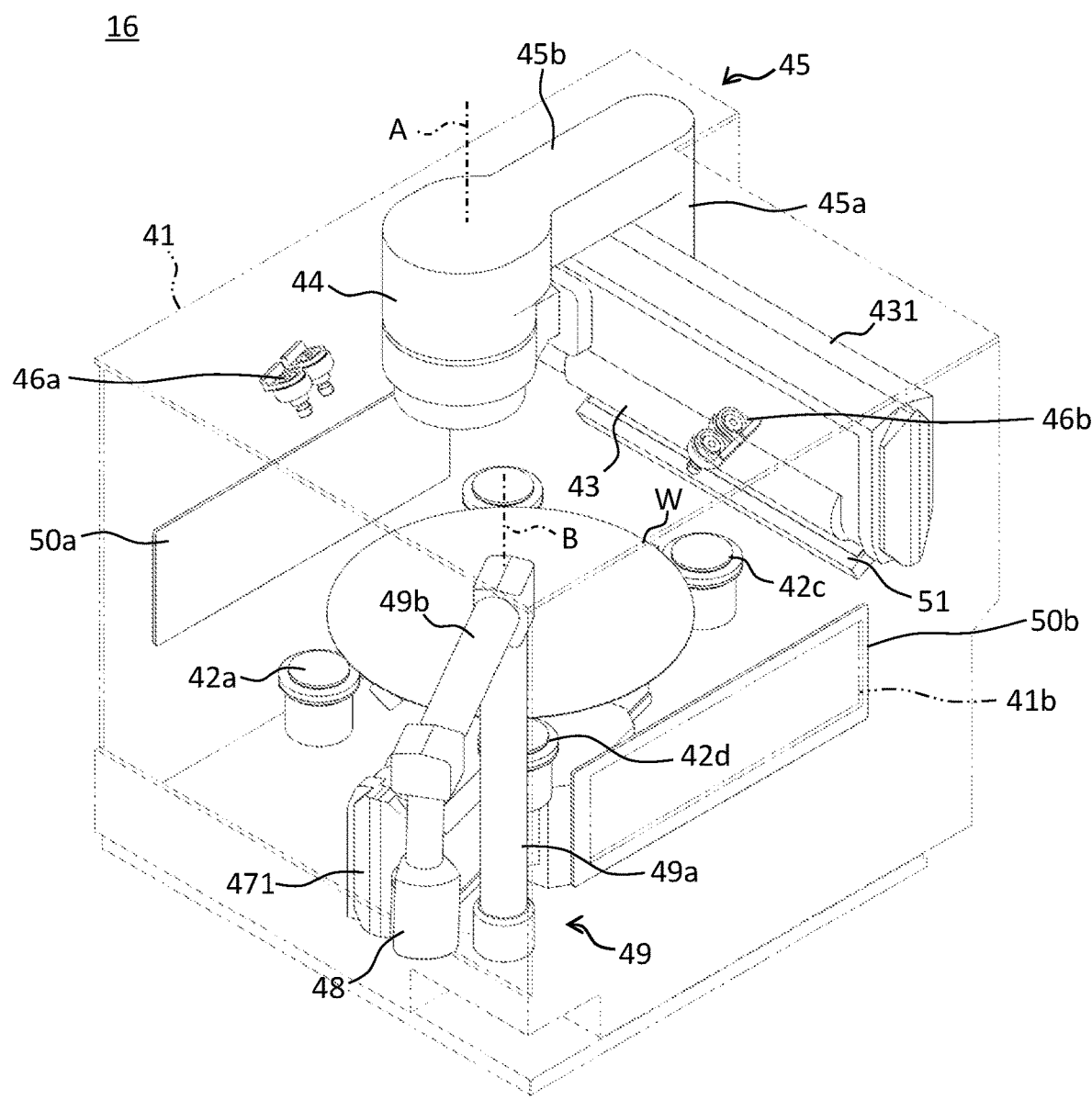
FIG. 12 is a transparent perspective view of a cleaning tank of a cleaning apparatus according to an embodiment, which shows a state in which a second cleaning means is located at a maintenance position.
Figure 13:
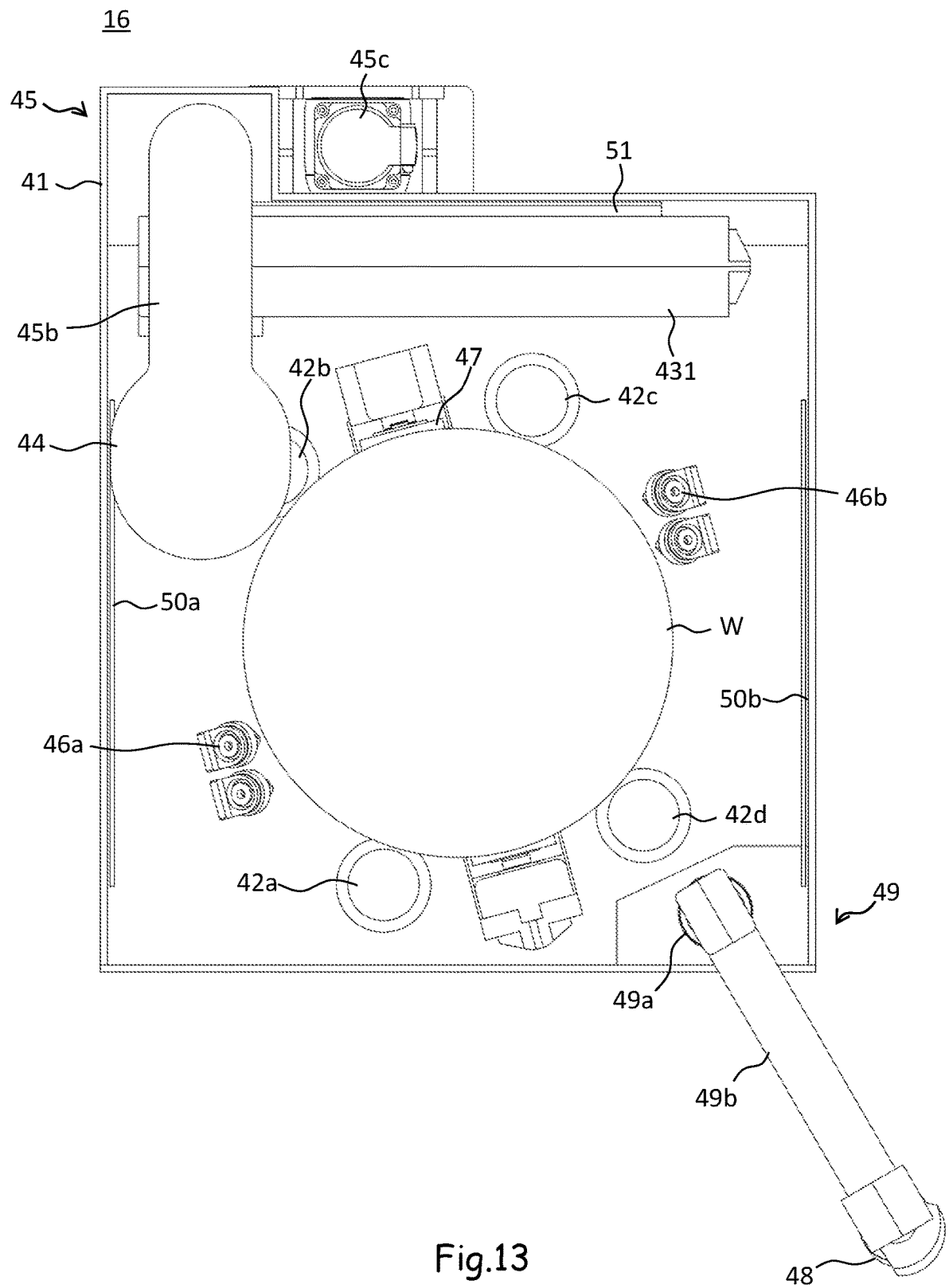
FIG. 13 is an internal plan view of the cleaning apparatus shown in FIG. 12 when viewed from above.
Figure 14:
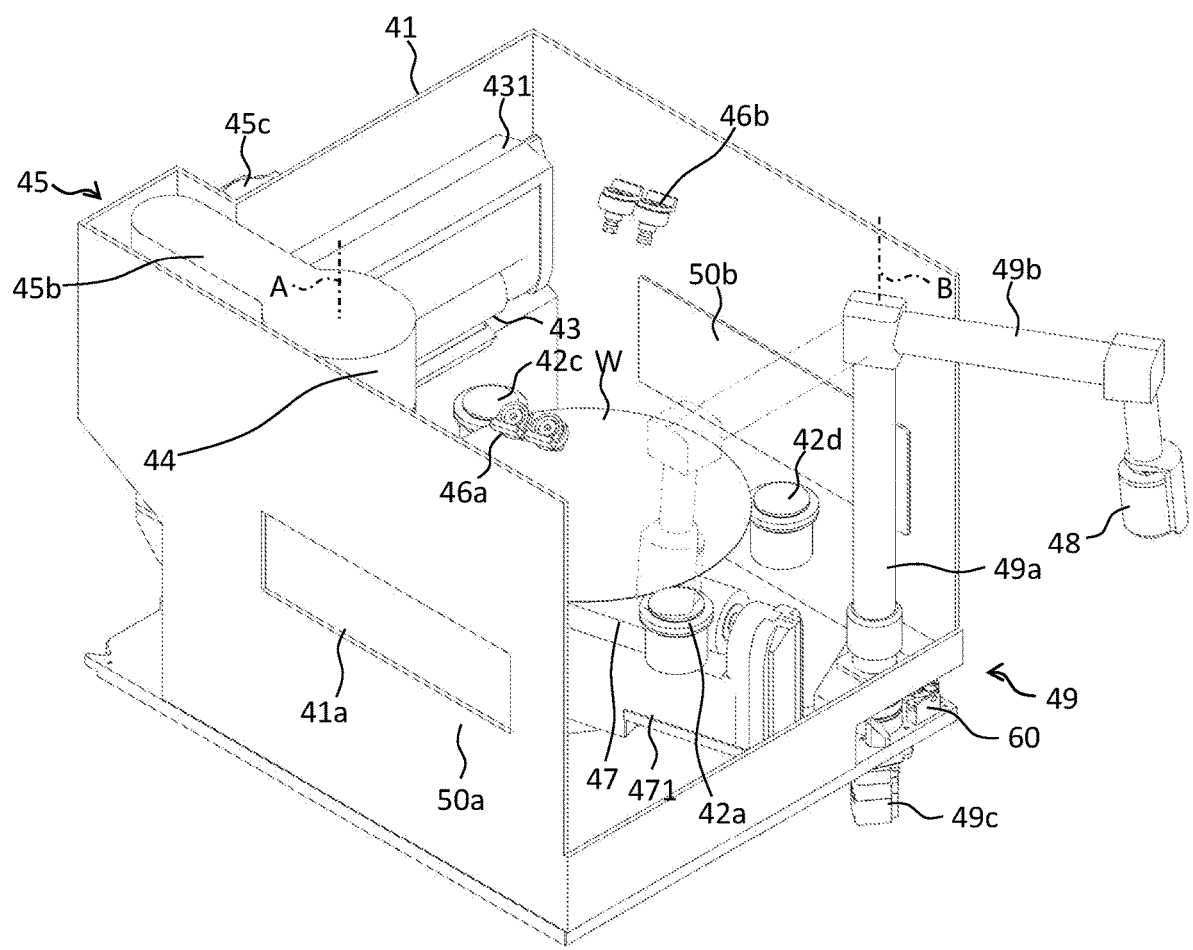
FIG. 14 is a perspective view of the cleaning apparatus shown in FIG. 12 when viewed from the left side.

In the present embodiment, the second swing mechanism 49 swings the second cleaning means 48 around the second swing axis B to move the second cleaning means 48 between the second retracted position outside the wafer W and inside the cleaning tank 41 (see FIGS. 2 to 9), the second cleaning position directly above the wafer W (see FIGS. 10 and 11), and a maintenance position outside the cleaning tank 41 (see FIGS. 12 to 14).

Figure 10:
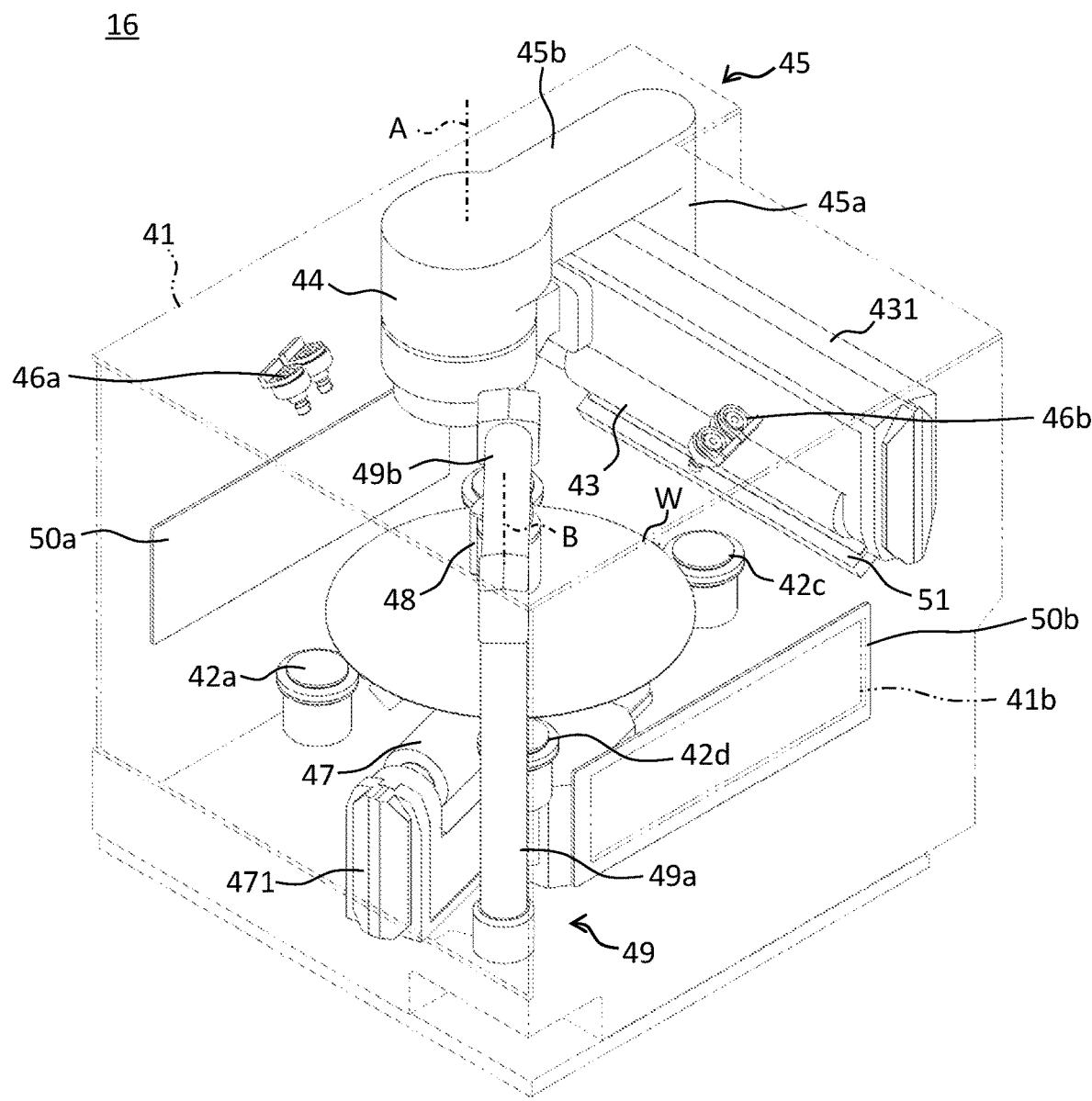
FIG. 10 is a transparent perspective view of a cleaning tank of a cleaning apparatus according to an embodiment, which shows a state in which a cleaning member is located at a retracted position and a second cleaning means is located at a second cleaning position.

FIG. 10 is a transparent perspective view of the cleaning tank 41 of the cleaning apparatus 16, which shows a state in which the cleaning member 43 is located at the retracted position and the second cleaning means 48 is located at the second cleaning position. FIG. 11 is an internal plan view of the cleaning apparatus 16 shown in FIG. 10 when viewed from above.

As shown in FIGS. 10 and 11, with the cleaning member 43 arranged at the retracted position and the second cleaning means 48 arranged at the second cleaning position, the second cleaning means 48 sprays a jet stream onto the surface of the wafer W, and the second swing mechanism 49 swings the second cleaning means 48 around the second swing axis B to cause the second cleaning means 48 to reciprocate from one (for example, left-side) peripheral edge of the surface of the wafer W through the center of the wafer W to the other (for example, right-side) peripheral edge of the wafer W, so that the jet stream is supplied to the entire surface of the rotated wafer W to clean the entire surface of the wafer W.

FIG. 12 is a transparent perspective view of the cleaning tank 41 of the cleaning apparatus 16, which shows a state in which the second cleaning means 48 is located at the maintenance position. FIG. 13 is an internal plan view of the cleaning apparatus 16 shown in FIG. 12 when viewed from above. FIG. 14 is a perspective view of the cleaning apparatus 16 shown in FIG. 12 when viewed from the left side.

As shown in FIGS. 12 to 14, with a portion of the side wall surface of the cleaning tank 41 (the wall surface on the front side in the illustrated example) removed, the second swing mechanism 49 swings the second cleaning means 48 around the second swing axis B, so that the second cleaning means 48 is moved to the maintenance position outside the cleaning tank 41. Since the second cleaning means 48 is movable to the maintenance position, the operator who replaces or maintains the second cleaning means 48 can easily access the second cleaning means 48, resulting in improvement of work efficiency.

The second swing mechanism 49 may cause the second cleaning means 48 to be retracted to outside of the cleaning tank 41 when the cleaning member 43 is replaced or maintained inside the cleaning tank 41. Since the second cleaning means 48 is retracted to the outside of the cleaning tank 41, the operator who replaces or maintains the cleaning member 43 can access the cleaning member 43 without blockage of the path by the second cleaning means 48, resulting in improvement of work efficiency.

In the present embodiment, the cleaning apparatus 16 is provided with a monitoring means 60 that monitors whether the second cleaning means 48 is located outside the cleaning tank 41.

Figure 15:
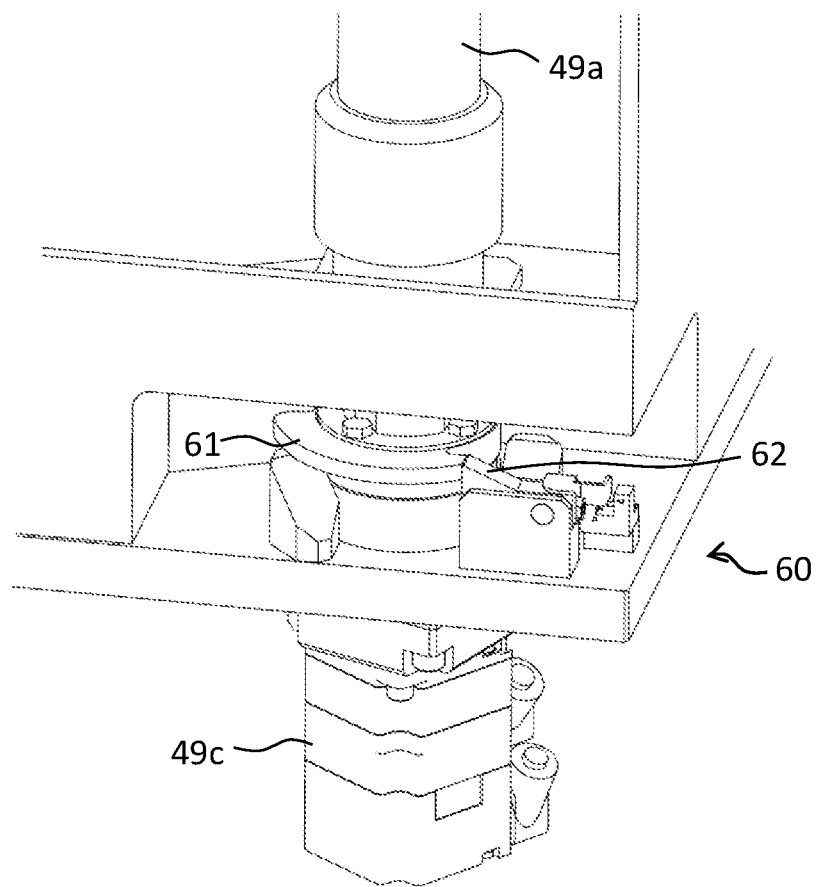
FIG. 15 is an enlarged perspective view of a monitoring means in a state where the second cleaning means is located inside the cleaning tank.
Figure 16:
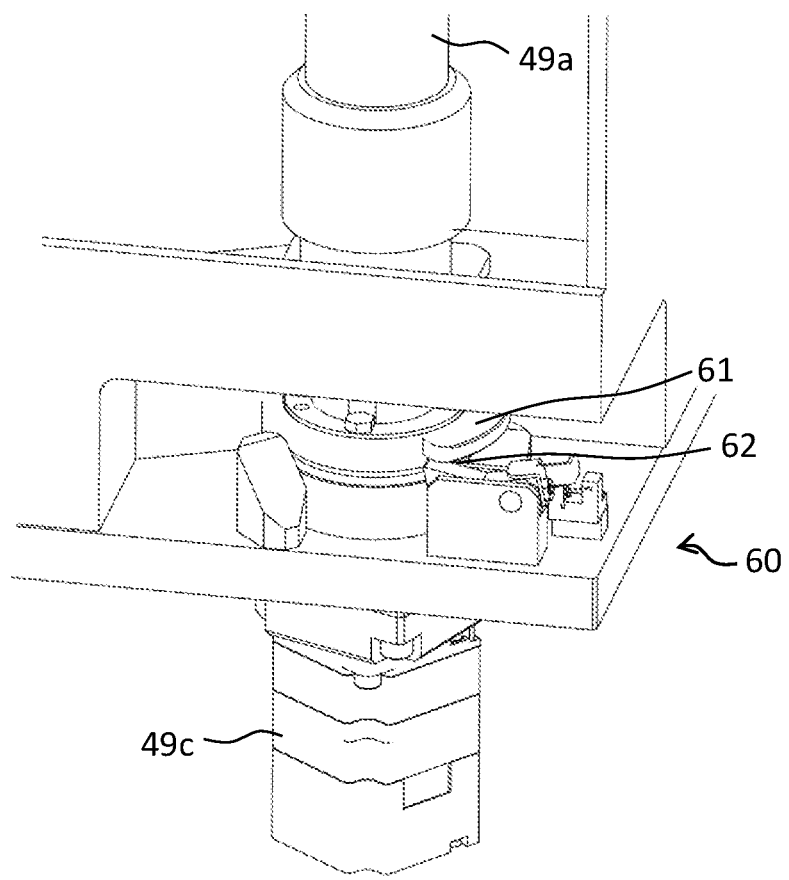
FIG. 16 is an enlarged perspective view of a monitoring means in a state where the second cleaning means is located outside the cleaning tank.

FIG. 15 is an enlarged perspective view of the monitoring means 60 in a state where the second cleaning means 48 is located inside the cleaning tank 41. FIG. 16 is an enlarged perspective view of the monitoring means 60 in a state where the second cleaning means 48 is located outside the cleaning tank 41.

In the examples shown in FIGS. 15 and 16, the monitoring means 60 has a flange part 61 and a switch 62. The flange part 61 is coaxially fixed to the lower end of the second pillar part 49a of the second swing mechanism 49, and when the second pillar part 49a is rotated around the second swing axis B by the second driving means 49c, the flange part 61 is rotated integrally with the second pillar part 49a.

The switch 62 is a mechanical switch, for example, and is arranged adjacent to the flange part 61. As shown in FIG. 16, when the second swing mechanism 49 (or the operator) swings the second cleaning means 48 around the second swing axis B to move it from inside to outside of the cleaning tank 41, the flange part 61 is rotated in one direction around the second swing axis B together with the second pillar part 49a to come into contact with the switch 62, whereby the switch 62 is pushed down. As a result, the switch 62 is turned off, and it is detected that the second cleaning means 48 is located outside the cleaning tank 41. On the other hand, as shown in FIG. 15, when the second swing mechanism 49 (or the operator) swings the second cleaning means 48 around the second swing axis B to move it from outside to inside of the cleaning tank 41, the flange part 61 is rotated in the opposite direction around the second swing axis B together with the second pillar part 49a to separate from the switch 62, whereby the switch 62 is returned to the initial state by restoring force. As a result, the switch 62 is turned on, and it is detected that the second cleaning means 48 is located inside the cleaning tank 41. In this case, the switch 62 is turned off when the second cleaning means 48 is located outside the cleaning tank 41, and the switch 62 is turned on when the second cleaning means 48 is located inside the cleaning tank 41. However, the present invention is not limited to this, and the switch 62 may be turned on when the second cleaning means 48 is located outside the cleaning tank 41, and the switch 62 may be turned off when the second cleaning means 48 is located inside the cleaning tank 41.

When it is detected that the second cleaning means 48 is located outside the cleaning tank 41, the monitoring means 60 may transmit a stop signal to the operation control unit of the second cleaning means 48 to stop the operation of the second cleaning means 48 (for example, spraying a jet stream). When the second cleaning means 48 is located outside the cleaning tank 41, the monitoring means 60 automatically stops the operation of the second cleaning means 48, so that it is possible to prevent the second cleaning means 48 in operation from being moved to outside of the cleaning tank 41 to contaminate the outside of the cleaning tank 41 by the operation of the second cleaning means 48 (for example, spraying a jet stream).

As shown in FIGS. 6 and 7, with the second arm part 49b of the second swing mechanism 49 arranged at a height position higher than the cleaning member 43, the cleaning member 43 arranged at the cleaning position, and the second cleaning means 48 arranged at the second retracted position, the end part of the cleaning member 43 may go into under the second arm part 49b of the second swing mechanism 49. In this case, the internal space of the cleaning tank 41 can be efficiently used, which makes the footprint of the cleaning tank 41 smaller.

Figure 17:
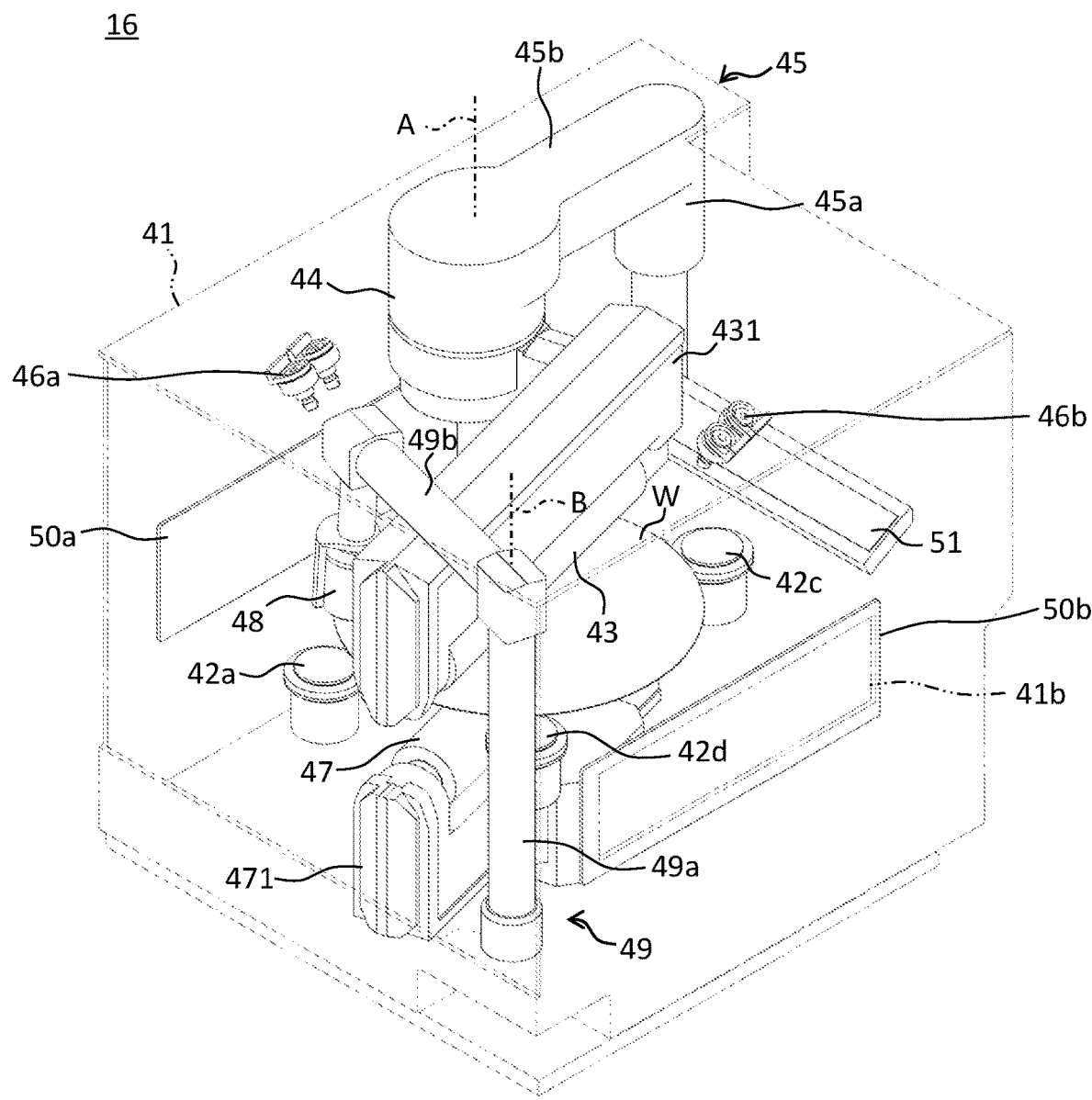
FIG. 17 is a transparent perspective view of a cleaning tank of a cleaning apparatus according to an embodiment, which shows a state in which a cleaning member is located at a cleaning position and a second cleaning means is located at a second cleaning position.
Figure 18:
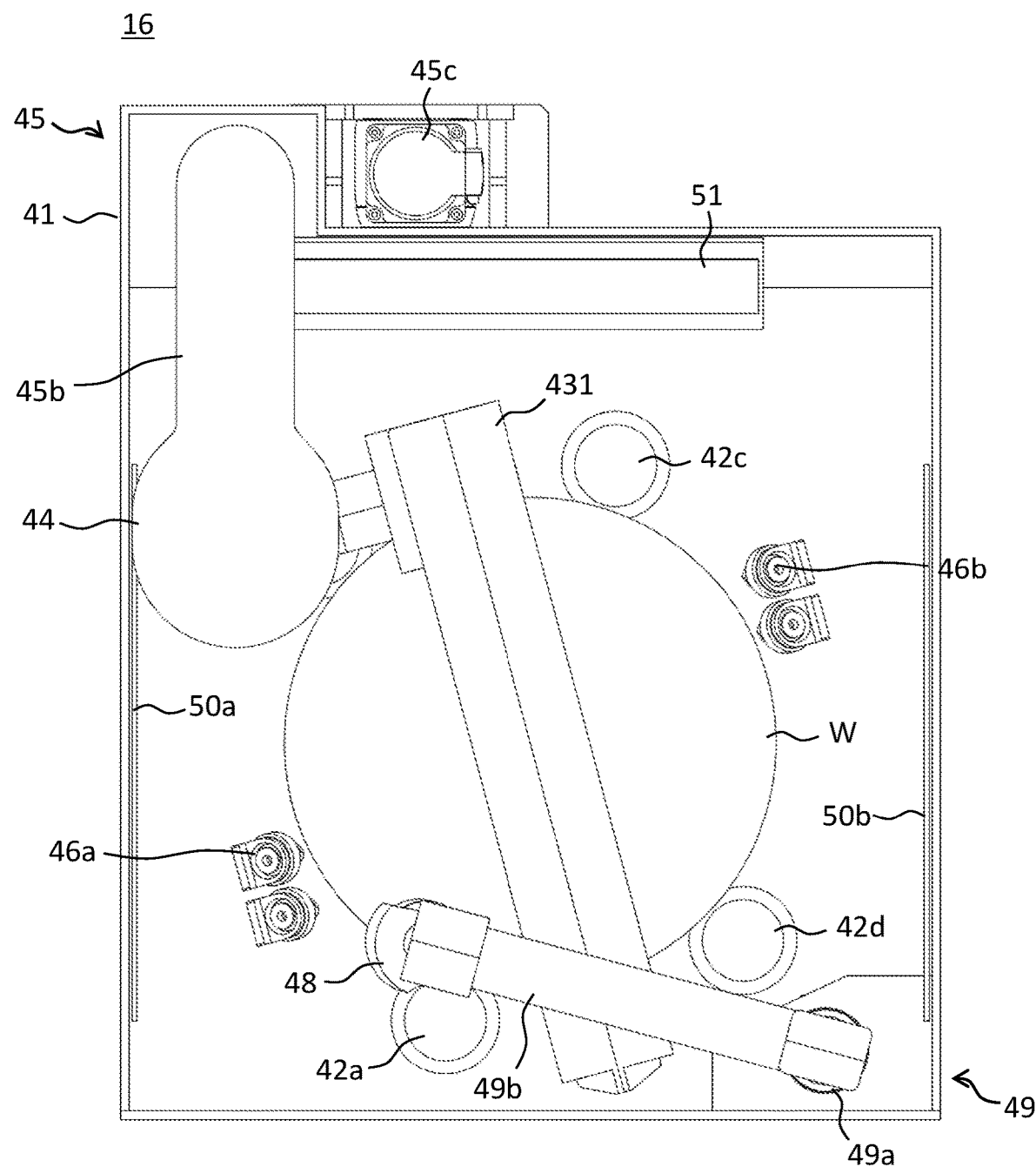
FIG. 18 is an internal plan view of the cleaning apparatus shown in FIG. 17 when viewed from above.

As shown in FIGS. 17 and 18, with the cleaning member 43 arranged at the cleaning position, the second swing mechanism 49 may swing the second cleaning means 48 around the second swing axis B to move the second cleaning means 48 to directly above the peripheral edge of the wafer W from the second retracted position. As a result, the surface of the wafer W can be roll scrubbed by the cleaning member 43, and at the same time, the peripheral edge of the surface of the wafer W can be cleaned in a non-contact manner by a jet stream supplied from the second cleaning means 48.

Next, the operation of the cleaning apparatus 16 having such a configuration will be described.

First, referring to FIGS. 2 to 5, with the cleaning member 43 arranged at the retracted position outside the wafer W and the second cleaning means 48 arranged at the second retracted position outside the wafer W, the shutter 50a is in the open state, and the wafer W to be cleaned (for example, the wafer W having undergone a polishing process) is loaded into the cleaning tank 41 through the wafer loading/unloading port 41a. The wafer W is held and rotated by the wafer rotation mechanism 42.

Next, with the cleaning member 43 separated from the cleaning means 51, as shown in FIGS. 8 and 9, the swing mechanism 44 swings (turns) the cleaning member 43 around the swing axis A to move the cleaning member 43 from the retracted position to the cleaning position directly above the wafer W. When the swing mechanism 44 swings the cleaning member 43 around the swing axis A, the cleaning member 43 passes directly above the center of the wafer W.

Next, as shown in FIGS. 6 and 7, with the cleaning member 43 arranged at the cleaning position, the raising and lowering mechanism 45 moves the cleaning member 43 downward to bring the peripheral surface of the cleaning member 43 into contact with the surface of the wafer W. Further, a means for raising and lowering the back surface cleaning member 47 (not shown) moves the back surface cleaning member 47 upward to bring the peripheral surface of the back surface cleaning member 47 into contact with the back surface of the wafer W. The downward movement of the cleaning member 43 and the raising/lowering operation of the back surface cleaning member 47 may be performed in the reverse of the above order or in parallel.

With the peripheral surface of the cleaning member 43 in contact with the surface of the wafer W, a cleaning solution is sprayed from the liquid supply nozzles 46a and 46b toward the surface of the rotated wafer W, and the cleaning member 43 is rotated (turned) to clean the surface of the wafer W. Similarly, with the peripheral surface of the back surface cleaning member 47 in contact with the back surface of the wafer W, a cleaning solution is sprayed from nozzles not shown toward the back surface of the wafer W, and the back surface cleaning member 47 is rotated (turned) to clean the back surface of the wafer W.

At this time, as shown in FIGS. 16 and 17, the second swing mechanism 49 may swing the second cleaning means 48 around the second swing axis B to move the second cleaning means 48 from the second retracted position to directly above the wafer W, and cause the second cleaning means 48 to spray a jet stream while swinging the second cleaning means 48, thereby cleaning the surface of the wafer W in a non-contact manner. The surface of the wafer W can be roll scrubbed by the cleaning member 43, and at the same time, the surface of the wafer W can be cleaned in a non-contact manner by the jet stream supplied from the second cleaning means 48, resulting in improvement of cleaning efficiency. At this time, the second swing mechanism 49 may swing the second cleaning means 48 around the second swing axis B to move the second cleaning means 48 from the second retracted position to directly above the peripheral edge of the wafer W, and cause the second cleaning means 48 to spray a jet stream while swinging the second cleaning means 48, thereby cleaning the peripheral edge of the wafer W in a non-contact manner.

After the cleaning of the surface of the wafer W by the cleaning member 43 is completed, the raising and lowering mechanism 45 moves the cleaning member 43 upward and separates the peripheral surface of the cleaning member 43 from the surface of the wafer W. Then, as shown in FIGS. 8 and 9, the swing mechanism 44 swings (turns) the cleaning member 43 around the swing axis A to move the cleaning member 43 from the cleaning position to the retracted position outside the wafer W.

Next, as shown in FIGS. 10 and 11, the second swing mechanism 49 swings (turns) the second cleaning means 48 around the second swing axis, to move the second cleaning means 48 from the second retracted position to the second cleaning position directly above the wafer W. Then, the second cleaning means 48 sprays a jet stream onto the surface of the wafer W, and the second swing mechanism 49 swings the second cleaning means 48 around the second swing axis B to cause the second cleaning means 48 to reciprocate from one (for example, left-side) peripheral edge of the surface of the wafer W through the center of the wafer W to the other (for example, right-side) peripheral edge of the wafer W, so that the jet stream is supplied to the entire surface of the rotated wafer W to clean the entire surface of the wafer W in a non-contact manner.

After cleaning the surface of the wafer W by the second cleaning means 48 is completed, the second swing mechanism 49 swings (turns) the second cleaning means 48 around the swing axis A, to move the second cleaning means 48 from the second cleaning position to the second retracted position outside the wafer W. Then, the shutter 50b is opened, and the wafer W having undergone the cleaning process is unloaded from the cleaning tank 41 through the wafer loading/unloading port 41b.

In the above-described embodiment, the wafer W is cleaned by the cleaning member 43, and then the wafer W is cleaned by the second cleaning means 48. Alternatively, the wafer W may be cleaned by the second cleaning means 48 before the cleaning of the wafer W by the cleaning member 43.

After cleaning a plurality of wafers W by the cleaning process as described above, in order to perform replacement or maintenance of the second cleaning means 48, as shown in FIGS. 12 to 14, a part of the side wall surface of the cleaning tank 41 (the wall surface on the front side in the illustrated example) is removed, and then the second swing mechanism 49 swings the second cleaning means 48 around the second swing axis B to move the second cleaning means 48 to the maintenance position outside the cleaning tank 41. Thus, the operator who replaces or maintains the second cleaning means 48 can easily access the second cleaning means 48, resulting in improvement of work efficiency.

Further, in order to replace or maintain the first cleaning means 43 inside the cleaning tank 41, the second swing mechanism 49 swings the second cleaning means 48 around the second swing axis B to retract the second cleaning means 48 to the outside of the cleaning tank 41. Thus, the operator who replaces or maintains the cleaning member 43 can access the cleaning member 43 without blockage of the path by the second cleaning means 48, resulting in improvement of work efficiency.

According to the present embodiment as described above, even if the cleaning member 43 is a long member that is longer than the radius of the wafer W, the distance L from the center of the cleaning member 43 to the swing axis A of the swing mechanism 44 is prescribed as being smaller than the diameter of the wafer W, and the cleaning member 43 is moved from the retracted position to the cleaning position by swinging around the swing axis A, so that it is possible to reduce a space required for moving the cleaning member 43 from the cleaning position to the retracted position (that is, a space through which the cleaning member 43 passes) as compared with the case where the cleaning member 43 is linearly moved (run) from the retracted position to the cleaning position. Further, since the swing axis A of the swing mechanism 44 is located inside the cleaning tank 41, it is not required to form an opening for running on the side wall of the cleaning tank 41. Therefore, in the cleaning apparatus 16 capable of moving the cleaning member 43 from the retracted position to the cleaning position, it is possible to reduce the footprint of the cleaning tank 41 without forming an opening for running on the side wall of the cleaning tank 41. Further, according to the present embodiment, since it is not required to form an opening for running on the side wall of the cleaning tank 41, it is possible to correct the leakage of the chemical liquid atmosphere to the outside of the cleaning tank 41.

Further, according to the present embodiment, the swing axis A of the swing mechanism 44 is located at a position away from the extension line of the central axis of the cleaning member 43, and is not on the extension line of the central axis of the cleaning member 43. Thus, the distance L from the center of the cleaning member 43 to the swing axis A can be reduced to less than half the length of the cleaning member 43. This further reduces the space required for moving the cleaning member 43 from the cleaning position to the retracted position (the space through which the cleaning member passes), and makes the footprint of the cleaning tank 41 smaller.

According to the present embodiment, since the swing angle θ at which the swing mechanism 44 moves the cleaning member 43 from the retracted position to the cleaning position is smaller than 90°, it is possible to further reduce the space required for moving the cleaning member 43 from the cleaning position to the retracted position (the space through which the cleaning member passes) and make the footprint of the cleaning tank 41 smaller, as compared with the case where the swing angle is equal to or greater than 90°.

Further, according to the present embodiment, the arm part 45*b* of the raising and lowering mechanism 45 extends laterally so as to straddle above the retracted position, and when the cleaning member 43 is located at the retracted position, the cleaning member 43 is housed in a space below the arm part 45*b*, so that the internal space of the cleaning tank 41 can be used efficiently, thereby making the footprint of the cleaning tank 41 smaller.

According to the present embodiment, even if the cleaning member 43 is a long member that is longer than the radius of the wafer W, the cleaning member 43 is moved from the retracted position to the cleaning position by swinging around the swing axis A, so that it is possible to reduce a space required for moving the cleaning member 43 from the cleaning position to the retracted position (a space through which the cleaning member passes) as compared with the case where the cleaning member 43 is linearly moved (run) from the retracted position to the cleaning position. Additionally, since the swing axis A is located inside the cleaning tank 41, it is not required to form an opening for running on the side wall of the cleaning tank 41. Therefore, in the cleaning apparatus 16 capable of moving the cleaning member 43 from the retracted position to the cleaning position, it is possible to reduce the footprint of the cleaning tank 41 without forming an opening for running on the side wall of the cleaning tank 41. Further, since it is not required to form an opening for running on the side wall of the cleaning tank 41, it is possible to correct the leakage of the chemical liquid atmosphere to the outside of the cleaning tank 41. Moreover, the cleaning member 43 that is swung around the swing axis A and moved from the retracted position to the cleaning position and the second cleaning means 48 that is swung around the second swing axis B and caused to pass directly above the center of the wafer W are arranged in the same cleaning tank 41, so that, before or after the roll scrub cleaning step by the cleaning member 43, the second cleaning means 48 can be swung so as to pass through the center of the wafer W to clean the surface of the wafer W in the same cleaning tank 41. This makes it possible to improve wafer per hour (WPH) and cleaning performance.

Further, according to the present embodiment, even if the cleaning member 43 is a long member that is longer than the radius of the wafer W, the distance L from the center of the cleaning member 43 to the swing axis A is smaller than the diameter D of the wafer W, and when the swing mechanism 44 swings the cleaning member 43 around the swing axis A, the cleaning member 43 passes directly above the center of the wafer W, so that it is possible to reduce a space required for moving the cleaning member 43 from the cleaning position to the retracted position (a space through which the cleaning member passes) as compared with the case where the cleaning member 43 is linearly moved (run) from the retracted position to the cleaning position.

According to the present embodiment, when the cleaning member 43 is replaced or maintained inside the cleaning tank 41, the second swing mechanism 49 retracts the second cleaning means 48 to the outside of the cleaning tank 41, so that the operator can access the cleaning member 43 without being hindered by the second cleaning means 48, which results in improvement of work efficiency.

Further, according to the present embodiment, since there is provided the monitoring means 60 for monitoring whether the second cleaning means 48 is located outside the cleaning tank 41, the monitoring means 60 can automatically check whether the second cleaning means 48 is located outside the cleaning tank 41 without the operator's visual check, thereby resulting in improvement of work efficiency.

According to the present embodiment, when the second cleaning means 48 is located outside the cleaning tank 41, the monitoring means 60 automatically stops the operation of the second cleaning means 48, so that it is possible to prevent the operation of the second cleaning means 48 from being erroneously continued to contaminate the outside of the cleaning tank 41.

Further, according to the present embodiment, since the swing axis A and the second swing axis B are positioned opposite to each other when viewed from the center of the wafer W, the internal space of the cleaning tank 41 can be efficiently used to make the footprint of the cleaning tank 41 smaller.

The embodiments and modifications of the present technique have been described so far as an exemplification. However, the scope of the present technique is not limited to them but can be changed or modified according to the purpose of use within the scope of the claims. In addition, the embodiments and modifications can be appropriately combined as long as there are no inconsistencies in the contents of processing.

What is claimed is:

1. A cleaning apparatus comprising:
a cleaning tank that defines a cleaning space for cleaning a wafer;
a wafer rotation mechanism that is arranged inside the cleaning tank and holds and rotates the wafer;
a cleaning member that contacts and cleans a surface of the wafer, and is rotatable around a central axis extending in a lateral direction;
a swing mechanism that swings the cleaning member around a swing axis located inside the cleaning tank to move the cleaning member from a retracted position outside of the wafer to a cleaning position directly above the wafer;
a holder that holds the cleaning member; and
a raising and lowering mechanism that raises and lowers the cleaning member, wherein
a length of the cleaning member is longer than a radius of the wafer,
a distance from a center of the cleaning member to the swing axis is smaller than a diameter of the wafer,
when the swing mechanism swings the cleaning member around the swing axis, the cleaning member passes directly above a center of the wafer,
the raising and lowering mechanism has:
a pillar part that longitudinally extends; and
an arm part that extends laterally from the pillar part, and
a lower surface of the arm part is positioned above an upper surface of the holder.

2. The cleaning apparatus according to claim 1, wherein the swing axis is located at a position away from an extension line of the central axis of the cleaning member.

3. The cleaning apparatus according to claim 1, wherein a swing angle at which the swing mechanism moves the cleaning member from the retracted position to the cleaning position is smaller than 90°.

4. The cleaning apparatus according to claim 1, further comprising:
a load control mechanism that controls a load applied by the cleaning member to the surface of the wafer.

5. The cleaning apparatus according to claim 4, wherein the pillar part is provided so as to penetrate through a wall surface of the cleaning tank,
a driving means is provided at an end of the pillar part protruding to outside of the cleaning tank,
the swing mechanism is provided at a tip of the arm part, and
the raising and lowering mechanism integrally raises and lowers the cleaning member and the swing mechanism.

6. The cleaning apparatus according to claim 5, wherein the arm part extends in the lateral direction so as to straddle above or below the retracted position.

7. A polishing apparatus comprising:
a cleaning unit that cleans a wafer after polishing, wherein the cleaning unit includes:
a cleaning tank that defines a cleaning space for cleaning a wafer;
a wafer rotation mechanism that is arranged inside the cleaning tank and holds and rotates the wafer;
a cleaning member that contacts and cleans a surface of the wafer, and is rotatable around a central axis extending in a lateral direction;
a swing mechanism that swings the cleaning member around a swing axis located inside the cleaning tank to move the cleaning member from a retracted position outside of the wafer to a cleaning position directly above the wafer;
a holder that holds the cleaning member; and
a raising and lowering mechanism that raises and lowers the cleaning member, wherein
a length of the cleaning member is longer than a radius of the wafer,
a distance from a center of the cleaning member to the swing axis is smaller than a diameter of the wafer,
when the swing mechanism swings the cleaning member around the swing axis, the cleaning member passes directly above a center of the wafer,
the raising and lowering mechanism has:
a pillar part that longitudinally extends; and
an arm part that extends laterally from the pillar part, and
a lower surface of the arm part is positioned above an upper surface of the holder.

8. The polishing apparatus according to claim 7, wherein the swing axis is located at a position away from an extension line of the central axis of the cleaning member.

9. The polishing apparatus according to claim 7, wherein a swing angle at which the swing mechanism moves the cleaning member from the retracted position to the cleaning position is smaller than 90°.

10. The polishing apparatus according to claim 7, further comprising:
a load control mechanism that controls a load applied by the cleaning member to the surface of the wafer.

11. The polishing apparatus according to claim 10, wherein
the pillar part that longitudinally extends and is provided so as to penetrate through a wall surface of the cleaning tank;
a driving means is provided at an end of the pillar part protruding to outside of the cleaning tank,
the swing mechanism is provided at a tip of the arm part, and the raising and lowering mechanism integrally raises and lowers the cleaning member and the swing mechanism.

12. The polishing apparatus according to claim 11, wherein
the arm part extends in the lateral direction so as to straddle above or below the retracted position.

\* \* \* \* \*